(12) United States Patent
Okumoto et al.

(10) Patent No.: US 8,421,065 B2
(45) Date of Patent: Apr. 16, 2013

(54) ORGANIC ELECTROLUMINESCENT DISPLAY DEVICE

(75) Inventors: Kenji Okumoto, Kyoto (JP); Masafumi Matsui, Kyoto (JP); Kouhei Koresawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/413,113

(22) Filed: Mar. 6, 2012

(65) Prior Publication Data

US 2012/0168787 A1 Jul. 5, 2012

Related U.S. Application Data

(63) Continuation of application No. PCT/JP2009/004456, filed on Sep. 9, 2009.

(51) Int. Cl.
*H01L 27/32* (2006.01)

(52) U.S. Cl.
USPC .................................. 257/40; 257/89; 257/98

(58) Field of Classification Search .................... 257/40, 257/89, E27.12
See application file for complete search history.

(56) References Cited

U.S. PATENT DOCUMENTS

| | | | |
|---|---|---|---|
| 6,873,091 B2 | 3/2005 | Bechtel et al. | |
| 6,969,948 B2 | 11/2005 | Urabe et al. | |
| 6,971,938 B2 | 12/2005 | Urabe et al. | |
| 7,659,661 B2 | 2/2010 | Park | |
| 2003/0011306 A1 | 1/2003 | Bechtel et al. | |
| 2003/0107314 A1 | 6/2003 | Urabe et al. | |
| 2004/0147200 A1 | 7/2004 | Urabe et al. | |
| 2006/0102913 A1 | 5/2006 | Park | |
| 2007/0194679 A1 | 8/2007 | Jo et al. | |
| 2008/0237615 A1* | 10/2008 | Lee et al. | 257/89 |
| 2009/0212687 A1* | 8/2009 | Cok | 313/504 |
| 2009/0285977 A1 | 11/2009 | Park | |
| 2010/0327297 A1 | 12/2010 | Yoshida et al. | |
| 2012/0025699 A1 | 2/2012 | Okumoto et al. | |
| 2012/0086332 A1 | 4/2012 | Matsui et al. | |

FOREIGN PATENT DOCUMENTS

| | | |
|---|---|---|
| JP | 2003-017263 | 1/2003 |
| JP | 2003-115378 | 4/2003 |
| JP | 2003-173875 | 6/2003 |

(Continued)

OTHER PUBLICATIONS

International Search Report in PCT/JP2009/004456, dated Dec. 28, 2009.

*Primary Examiner* — Olik Chaudhuri
*Assistant Examiner* — Wilner Jean Baptiste
(74) *Attorney, Agent, or Firm* — Greenblum & Bernstein, P.L.C.

(57) ABSTRACT

An organic electroluminescent display device which satisfies all of chromatic purity, transmission factor, reduction in reflection, and reflected color in balance at low cost is provided. An organic electroluminescent (EL) display device includes: a main substrate; an organic light-emitting layer formed above the main substrate and including a red light-emitting layer which emits red light, a green light-emitting layer which emits green light, a blue light-emitting layer which emits blue light, and a bank which is a non-light emitting region; a first light-adjusting layer formed above the blue light-emitting layer and the bank, which selectively transmits the blue light and selectively absorbs the green light and the red light; and a second light-adjusting layer formed above the red light-emitting layer and the green light-emitting layer, which selectively absorbs the blue light and selectively transmits the green light and the red light.

14 Claims, 23 Drawing Sheets

FOREIGN PATENT DOCUMENTS

| | | |
|---|---|---|
| JP | 2003-234186 | 8/2003 |
| JP | 2006-147561 | 6/2006 |
| JP | 2007-226239 | 9/2007 |
| JP | 2009-032576 | 2/2009 |
| JP | 2010-244885 | 10/2010 |

* cited by examiner

ORGANIC ELECTROLUMINESCENT DISPLAY DEVICE

CROSS REFERENCE TO RELATED APPLICATION

This is a continuation application of PCT Patent Application No. PCT/JP2009/004456 filed on Sep. 9, 2009, designating the United States of America. The entire disclosure of the above-identified application, including the specifications, drawings and claims are incorporated herein by reference in their entirety.

BACKGROUND OF THE INVENTION (1) Field of the Invention

The present invention relates to organic electroluminescent display devices (hereafter also referred to as organic EL display devices), and particularly relates to an organic EL display device including a light-adjusting layer for adjusting chromaticity of the light emitted from a light-emitting layer.

(2) Description of the Related Art

An organic EL display device is a light-emitting display device utilizing electroluminescence of organic compound, and bright light-emission at high luminance is easily obtained. Taking advantage of this property, the organic EL display device has been in practical use as a small display device used for mobile phones, for example.

The organic EL display device includes organic EL elements arranged on a substrate, and each of the organic EL display elements can be individually controlled for light emission for each pixel. The organic EL display device capable of emitting light in multiple colors includes single-color light-emitting organic EL elements each emits light in different colors (different wavelengths) such as blue, green, or red arranged periodically.

Requirements for the display quality of color display devices including multicolor light-emitting organic EL display device (hereafter also referred to as a color organic EL display device) includes high chromatic purity of outgoing light and that images with high contrast can be displayed. Conventionally, various display devices have been developed to accommodate these needs.

Here, high chromatic purity means that in chromaticity coordinate, a larger part of the region surrounded by a trajectory of single-wavelength light in a visible light range can be represented.

Contrast is a ratio of luminance in a non-light emitting region and a light-emitting region (luminance of light-emitting region divided by luminance of non-light emitting region). When the luminance of the non-light emitting region is high due to reflected external light or others, the contrast is inherently low, and the display device cannot display a sharp image. On the other hand, when the luminance of the non-light emitting region is low, the contrast is high, and deeper black can be displayed, allowing the display device to display a sharp image.

Contrast is important when watching the display device in a bright place. Since the non-light emitting region reflects external light such as interior lighting, the luminance in the non-light emitting region is high, making it difficult to increase the contrast. In order to increase the contrast in bright place, it is necessary to decrease the reflectance of the external light at the non-light emitting region.

In view of these concerns, in a display device including only light-emitting pixels, the function for increasing the chromatic purity and suppressing reflection of external light is not sufficient.

The patent literature 1 (Japanese Unexamined Patent Application Publication No. 2003-173875) discloses a multicolor light-emitting organic EL display device with a wavelength selectivity that allows a portion of a wavelength selecting layer (color filter) corresponding to each organic EL element to selectively transmit light in blue, green, or red emitted from the organic EL element. A conventional configuration for providing visible light absorbing material on the non-light emitting region between adjacent organic EL elements (referred to as black matrix) may be combined with this configuration.

According to this multicolor organic EL display device, a color filter with a wavelength selecting property suitable for the color of outgoing light increases the chromatic purity of outgoing light from each organic EL element, and the visible-light absorbing material absorbing the external light allows a display of an image with high contrast.

The patent literature 2 (Japanese Unexamined Patent Application Publication No. 2007-226239) discloses a display filter which absorbs light at a wavelength between the wavelengths of two outgoing light (for example, an intermediate wavelength between blue and green and an intermediate wavelength between green and red) at the entire surface and a plasma display panel using the display filter. With this display filter, the chromatic purity of the outgoing light increases by an absorption of the light at the intermediate wavelength included in the outgoing light from each light-emitting pixel.

SUMMARY OF THE INVENTION

However, the conventional technology has the following problem.

For example, in the multicolor light-emitting organic EL display device according to the patent literature 1, portions of the color filter positioned with each organic EL element has wavelength selectivity suitable for the color of outgoing light. While this achieves high chromatic purity, there is a problem in fabrication cost. For example, a process for separately painting four different materials, namely, pigments corresponding to color filters for blue, green, red, and a visible light absorbing material corresponding to the black matrix is necessary. As a result, high cost necessary for fabricating color filters is unavoidable.

The display filter according to the patent literature 2 has uniform wavelength selectivity at the entire surface. Thus, it is possible to fabricate the display filter at extremely low cost. However, there is a problem that the display filter is not suitable for an organic EL display device having close light-emission peak wavelengths of blue light and green light. Absorbing light at the wavelength intermediate between blue and green light in the organic EL display device absorbs light at a useful wavelength, and causes a problem such as a significant reduction in light-emitting efficiency of green at the price of chromatic purity of blue.

Furthermore, in order to improve the contrast, a method of reducing the reflectance of external light using a polarizer is widely known. However, the polarizer is generally expensive, which is a big problem in terms of cost. Furthermore, with the polarizer, the transmittance of the light emitted from the inside of the device is low, and thus there is a problem of reduced luminance and increased power consumption.

The present invention has been conceived in order to solve these conventional problems, and it is an object of the present invention to provide an organic electroluminescent display device that satisfies all of cost, chromatic purity, transmission factor, reduction in reflection, and reflected color in a balanced manner.

In order to achieve the above object, the organic electroluminescent display device according to the present invention an organic electroluminescent (EL) display device including: a first substrate; an organic EL unit formed above the first substrate and including a red light-emitting region which emits red light, a green light-emitting region which emits green light, a blue light-emitting region which emits blue light, and a non-light emitting region; a first light-adjusting layer formed above the blue light-emitting region and the non-light emitting region, which selectively transmits the blue light and selectively absorbs the green light and the red light; a second light-adjusting layer formed above the red light-emitting region and the green light-emitting region, which selectively absorbs the blue light and selectively transmits the green light and the red light; and a third light-adjusting layer provided above the organic EL unit, in which the third light-adjusting layer has an absorption peak with a local maximum absorption wavelength in a range between 520 and 600 nm, and a full width at half maximum of the absorption peak is 100 nm or smaller.

According to the present invention, it is possible to provide an organic electroluminescent display device which satisfies balanced chromatic purity, transmission factor, reduced reflection, and reflected color at low cost.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings.

DESCRIPTION OF THE PREFERRED EMBODIMENT

Figure 1:
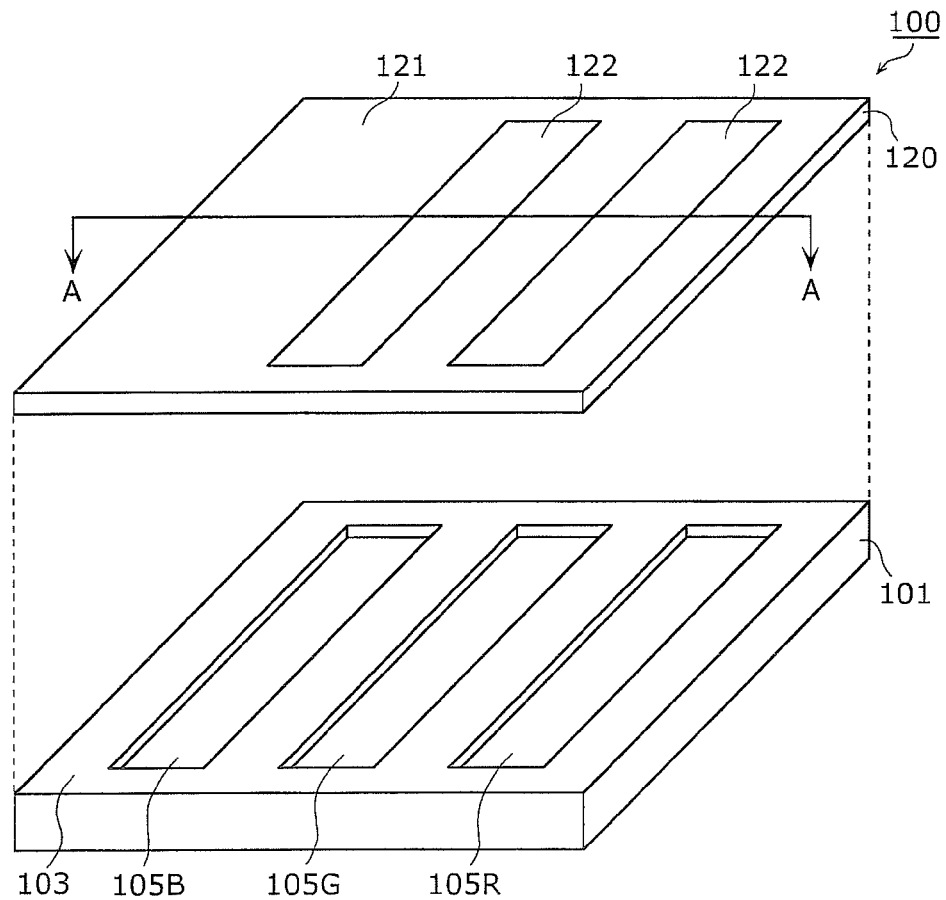
FIG. 1 is an exploded perspective view illustrating an example of schematic configuration of the organic EL display device according to the example 1 of the embodiment (pixel in which a red light-emitting region, a green light-emitting region, and a blue light-emitting region are used as one set)

The organic electroluminescent display device according to the present invention includes: a first substrate; an organic EL unit formed above the first substrate and including a red light-emitting region which emits red light, a green light-emitting region which emits green light, a blue light-emitting region which emits blue light, and a non-light emitting region; a first light-adjusting layer formed above the blue light-emitting region and the non-light emitting region, which selectively transmits the blue light and selectively absorbs the green light and the red light; and a second light-adjusting layer formed above the red light-emitting region and the green light-emitting region, which selectively absorbs the blue light and selectively transmits the green light and the red light.

With this, the first light-adjusting layer (for example, a blue color filter) provided above the blue light-emitting region and the non-light emitting region, and the second light-adjusting layer (for example, a yellow color filter) provided above the red light-emitting region and the green light-emitting region are provided. Thus, it is possible to achieve, with a much simpler configuration, chromatic purity and transmission factor comparable the conventional technology (configured with the color filters in three colors each corresponding to one of R, G, and B, and the black matrix). Furthermore, the blue light transmitted the first light-adjusting layer and the yellow light transmitted the second light-adjusting layer are complementary. Thus, the color of the reflected light is set to be closer to white.

Furthermore, with the conventional color filter, four materials for red (R), green (G), blue (B), and the black matrix (BM) are necessary. In contrast, the organic EL display device according to the present invention only requires two types materials, namely, for the first light-adjusting layer and the second light-adjusting layer, and thus productivity is increased.

Furthermore, even in separate black matrix is not used; it is possible to reduce the external light reflected on the display screen of the organic EL display device. In addition, the light-adjusting layer which selectively transmits the blue light and the light-adjusting layer which absorbs the external light in a region overlapping the non-light emitting region may be made of the same material.

In addition, the peak of the light-emission intensity of yellow is away from the peaks of the light-emissions of the green light and the red light. Thus, the second light-adjusting layer barely affects the chromaticity of the green light and the red light, and it is possible to maintain the chromaticity approximately at the same level as that of the conventional technology.

Furthermore, the second light-adjusting layer may also be provided above the non-light emitting region.

With this, above the non-light emitting region, both the first light-adjusting layer (blue color filter) and the second color filter (yellow color filter) are provided. Thus, the color of the non-light emitting region becomes closer to black, making the color of the reflected light closer to white. Accordingly, without using the black matrix provided separately, it is possible to reduce the reflection of the external light on the display screen of the organic EL display device as much as the black matrix.

Furthermore, a region above the non-light emitting region and in which the first light-adjusting layer and the second light-adjusting layer are formed may have a transmission property for transmitting light having a wavelength intermediate between the blue light and the green light.

With this, the reflected green light cancels out the blue-violet light emitted from the organic EL display device according to the present invention. Thus, it is possible to increase the contrast between the non-light emitting region and the light-emitting region.

Furthermore, the second light-adjusting layer may have an absorption peak with a local maximum absorption wavelength in a range between 520 and 600 nm, and a full width at half maximum of the absorption peak may be 100 nm or smaller.

With this, orange light is absorbed, reducing the reflection of the external light. This is particularly effective for reducing the reflection of the fluorescent light, since the light from the fluorescent light contains high orange component.

Furthermore, the organic electroluminescent display device may further include a second substrate which is different from the first substrate, in which the first light-adjusting layer is formed above the second substrate, and the first substrate and the second substrate are arranged such that the first light-adjusting layer and the organic EL unit face each other.

With this, it is possible to form the organic EL unit and the light-adjusting layer on different substrates by processes individual from each other.

Furthermore, the organic electroluminescent display device may further include a third light-adjusting layer provided above the organic EL unit, in which the third light-adjusting layer may have an absorption peak with a local maximum absorption wavelength in a range between 520 and 600 nm, and a full width at half maximum of the absorption peak is 100 nm or smaller.

With this, orange light is absorbed, further reducing the reflection of the external light.

Furthermore, the third light-adjusting layer may be a colored phase difference film, a colored polarizer film, a colored antireflection film, or a colored antiglare film.

Furthermore, the organic EL unit, the first light-adjusting layer, and the third light-adjusting layer may be stacked in this order.

Furthermore, the organic EL unit, the third light-adjusting layer, and the first light-adjusting layer may be stacked in this order.

Furthermore, the organic electroluminescent display device may further include: a second substrate which is different from the first substrate, in which the first light-adjusting layer and the third light-adjusting layer are formed on the second substrate in this order, and the first substrate and the second substrate are arranged such that the first light-adjusting layer and the organic EL unit face each other.

With this, it is possible to form the organic EL unit and the light-adjusting layers on different substrates by processes individual from each other.

Furthermore, the organic electroluminescent display device may further include: a second substrate which is different from the first substrate, the third light-adjusting layer is a colored resin layer, and the organic EL unit and the first light-adjusting layer are bonded by the third light-adjusting layer.

Furthermore, the third light-adjusting layer may be the second substrate made of colored glass or plastic.

Furthermore, the organic electroluminescent display device may further include: one of an antireflection film and an antiglare film, in which the third light-adjusting layer is a colored resin layer, and the one of the antireflection film and the antiglare film and the second substrate are bonded by the third light-adjusting layer.

Furthermore, the organic electroluminescent display device may further include: an anode and a cathode with the organic EL unit in between; and a third light-adjusting layer which is at least one organic layer provided between the anode and the cathode, in which the third light-adjusting layer has an absorption peak with a local maximum absorption wavelength in a range between 520 and 600 nm, and a full width at half maximum of the absorption peak is 100 nm or smaller.

Furthermore, the first light-adjusting layer has a transmission peak with a local maximum wavelength in a range between 400 and 480 nm, and a full width at half maximum of the transmission peak is 100 nm or smaller.

Furthermore, a wavelength of an absorption peak of the second light-adjusting layer may be 500 nm or smaller, and a wavelength of a transmission peak of the second light-adjusting layer may be 500 nm or greater.

The following shall describe an embodiment of the organic EL display device according to the present invention with reference to the drawings. Note that, although the description in the embodiment shall be made for a top-emission organic EL display device, the embodiment can be implemented using a bottom-emission organic EL display device.

In this embodiment, effectiveness and certainty of the present invention shall be described through comparison of configurations according to the examples 1 to 6 and the conventional comparative examples 1 to 4.

Example 1

The organic EL display device according to the example 1 includes an organic EL unit having a red light-emitting layer which emits red light, a green light-emitting layer which emits green light, a blue light-emitting layer which emits blue light, and a non-light emitting region. The feature of the organic EL display device according to the example 1 is that a first light-adjusting layer provided above the blue light-emitting layer above the non-light emitting region, which selectively transmits blue light and selectively absorbs light other than the blue light, and a second light-adjusting layer provided above the red light-emitting layer and the green light-emitting layer, which selectively absorbs the blue light and selectively transmits the light other than the blue light are formed.

Figure 2:
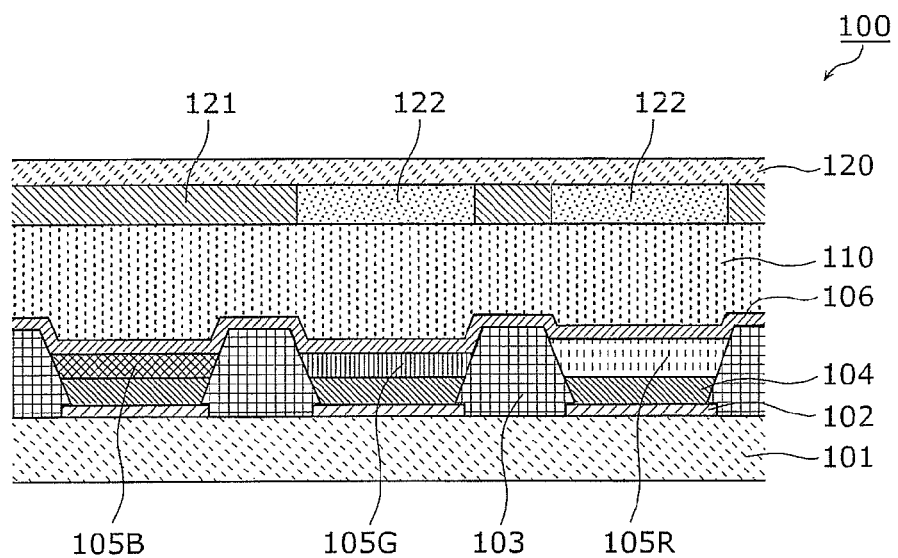
FIG. 2 is a cross-sectional view illustrating an example of a configuration of the organic EL display device according to the example 1 of the embodiment.

FIG. 1 is an exploded perspective view illustrating an example of the schematic configuration of the organic EL display device 100 according to the example 1 of the embodiment. FIG. 2 is a cross-sectional view of the organic EL display device 100 according to the example 1 according to the embodiment along A-A cross-section in FIG. 1.

As illustrated in FIG. 1, the organic EL display device 100 includes a main substrate 101 and the sub substrate 120. The main substrate 101 and the sub substrate 120 are bonded by an adhesive resin layer 110 (not illustrated in FIG. 1). Note that, that the main substrate 101 and the sub substrate 120 are bonded means that, not only the main substrate 101 and the sub substrate 120 are directly bonded, but also a layer formed on the main substrate 101 and a layer formed on the sub substrate 120 are bonded.

An organic EL unit is formed above the main substrate 101. The organic EL unit includes a red light-emitting layer 105R which emits red light (approximately 600 to 670 nm), a green light-emitting layer which emits green light (approximately 510 to 570 nm), a blue light-emitting layer 105B which emits blue light (approximately 440 to 500 nm), and a bank 103 which is a non-light emitting region. The light-emitting layers in each color and the non-light emitting region are formed on a display surface of the organic EL display device 100. Note that, the main substrate 101 is, for example, a glass substrate, and a drive circuit (not illustrated) including a transistor array and others is formed thereon.

The wavelengths of light emitted from the red light-emitting layer 105R, the green light-emitting layer 105G and the blue light-emitting layer 105B shall be described in detail later with reference to the drawings. Note that, the luminescent materials used for the red-light emitting layer 105R, the green-light emitting layer 105G, and the blue-light emitting layer 105B is not particularly limited, and may be a small-molecules material, a polymeric material, or the mixture of these materials. It is necessary for the light-emitting materials to emit light with a chromaticity relatively close to a preferred chromaticity of the outgoing light.

As illustrated in FIGS. 1 and 2, the first light-adjusting layer 121 and the second light-adjusting layer 122 are formed in the sub substrate 120. Note that, the sub substrate 120 is a transparent substrate such as a glass substrate with light-transmissive property.

The first light-adjusting layer 121 is a color filter formed above the blue light-emitting layer 105B and a bank 103 which is the non-light emitting region, which selectively transmits the blue light and selectively absorbs the green light and the red light, and is a blue color filter, for example. The first light-adjusting layer 121 can improve the contrast by improving the purity of blue light emitted from the blue light-emitting layer 105B, and absorbing the external light in a region above the bank 103 which is the non-light emitting region.

The second light-adjusting layer 122 is a color filter formed above the red light-emitting layer 105R and the blue light-emitting layer 105G, which selectively absorbs the blue light, and selectively transmits the green light and the red light, and is a yellow color filter, for example. The second light-adjusting layer 122 can improve the purity of the red light emitted from the red light-emitting layer 105R, and can improve the purity of the green light emitted from the green light-emitting layer 105G.

The materials for the first light-adjusting layer 121 and the second light-adjusting layer 122 are not particularly limited, and a resin including dispersed pigment or dye may be preferably used, for example. Note that, the absorption wavelengths and the transmission wavelengths of the first light-adjusting layer 121 and the second light-adjusting layer 122 shall be described in detail later with reference to the drawings.

Note that, in the organic EL display device 100 in the example 1, as illustrated in FIGS. 1 and 2, the first light-adjusting layer 121 and the second light-adjusting layer 122 are formed integrally as a single layer. Note that, the blue light-emitting layer 105B and the bank 103 are overlaid with the first light-adjusting layer 121, and the red light-emitting layer 105R and the green light-emitting layer 105G are overlaid with the second light-adjusting layer 122.

Here, the term "overlay" describes not only a case in which a lower layer is overlaid with an upper having the same area, but also a case in which the upper layer partially overlaps the lower layer. For example, a case in which a lower layer is overlaid with an upper layer larger than the lower layer in area, or a case in which a lower layer larger than the upper layer is overlaid with the upper layer is included.

More specifically, as illustrated in FIG. 1, the first light-adjusting layer 121 is formed above the blue light-emitting region 107 and the bank 103 such that the total area of the blue light-emitting layer 105B and the bank 103 and the area of the first light-adjusting layer 121 are identical. The second light-adjusting layer 122 is formed above the red light-adjusting layer 105R and the green light-emitting layer 105G such that the total area of the red light-emitting layer 105R and the green light-emitting layer 105G and the area of the second light-adjusting layer 122 are identical.

The organic EL display device 100 includes an anode 102, a hole transport layer 104, and a cathode 106, as illustrated in FIG. 2. The anode 102, the hole transport layer 104, the organic EL unit and the cathode 106 are formed above the main substrate 101 in this order.

The anode 102 is an electrode with light reflectivity formed on the main substrate 101, and injects holes on the organic light-emitting layer (the red light-emitting layer 105R, the green light-emitting layer 105G, and the blue light-emitting layer 105B) with an application of voltage. The anode 102 is patterned for each pixel, as illustrated in FIG. 2.

The material for the anode 102 is not particularly limited, and is aluminium, silver, chromium, or a nickel, for example. The anode 102 may also be a stacked structure composed of multiple layers, and may be indium tin oxide (ITO) formed on aluminium, for example.

The bank 103 is insulating resin for isolating the organic light-emitting layers (the red light-emitting layer 105R, the green light-emitting layer 105G, and the blue light-emitting layer 105B). The bank 103 does not emit light since the bank 103 is insulated, and no re-coupling of electron-hole pair occurs in the bank 103. As described above, the bank 103 serves as the non-light emitting region. The material of the bank 103 is not particularly limited, and an insulating and photosensitive resin such as a resist is used, for example.

The hole transport layer 104 is formed on the node 102, and is a layer for promoting injection of holes to the organic light-emitting layer. The material for the hole transport layer 104 is not particularly limited, and may be triarylamine derivative, for example. Note that, it may be a small-molecules material, a polymeric material, or a mixture of these materials.

The cathode 106 is an electrode which is formed on the organic light-emitting layers and the bank 103, and injects electrons on the organic light-emitting layer with an application of voltage. The material for the cathode 106 is not particularly limited, and for example, a stacked structure of lithium fluoride, and an alloy of magnesium and silver may be used. Note that, since the organic EL display device 100 according to the embodiment is a top-emission organic EL display device, it is preferable to have high transmission factor of visible light in order to increase the light-extraction efficiency.

The resin layer 110 is a resin with light-transmission property and adhesiveness, and bonds the main substrate 101 and the sub substrate 120. The organic EL unit and other components are formed on the main substrate 101, and the first light-adjusting layer 121 and the second light-adjusting layer 122 are formed on the sub substrate 120. The material for the resin layer 110 is not particularly limited, and an acrylic resin is used, for example.

Next, the fabrication method for the organic EL display device 100 in the example 1 of the embodiment shall be described with reference to FIG. 2.

First, the main substrate 101 is prepared. On the main substrate 101, a drive circuit including a transistor array well-known for the active matrix display device is formed.

Next, the anode 102 is formed. For example, aluminum or others which is the material for the anode 102 is deposited on the main substrate 101 by the vacuum vapor deposition or the sputtering, and is patterned into a predetermined shape (for example, for each pixel) by photolithography or others so as to form the anode 102. The method of forming the anode 102 is not particularly limited.

Next, the bank 103 is formed. For example, the material for the bank 103 is formed on the entire surface by wet process or others, and is patterned by the photolithography or others so as to expose the upper surface of the upper surface of the anode 102. As such, the bank 103 is formed. The method of forming the bank 103 is not particularly limited.

Next, the hole transport layer 104 is formed. For example, the hole transport layer 104 is formed by a wet process such as the inkjet method, or a dry process such as the vacuum vapor deposition. The method of forming the hole transport layer 104 is not particularly limited.

Next, the organic light-emitting layer (the red light-emitting layer 105R, the green light-emitting layer 105G, and the blue light-emitting layer 105B) is formed. For example, the red light-emitting layer 105R, the green light-emitting layer 105G and the blue light-emitting layer 105B are formed by applying the light-emitting materials for the organic light-emitting layers by an application method such as the inkjet method.

Next, the cathode 106 is formed. For example, the material for the cathode 106 is deposited on the entire surface of the organic light-emitting layers and the bank 103 by the vacuum vapor deposition or the sputtering so as to form the cathode 106.

Independent of the fabrication process described above, the sub substrate 120 including the first light-adjusting layer 121 and the second light-adjusting layer 122 is fabricated.

The method of forming the first light-adjusting layer 121 and the second light-adjusting layer 122 on the sub substrate 120 is not particularly limited. For example, photosensitive resin in which pigments or dye is dispersed is deposited on the sub substrate 120 by the application method or others, and is patterned by the photography or others so as to form the first light-adjusting layer 121 and the second light-adjusting layer 122.

Note that, the first light-adjusting layer 121 is formed such that the bank 103 which is the non-light emitting region and the blue light-emitting layer 105B are overlaid with the first light-adjusting layer 121 when the main substrate 101 and the sub substrate 120 are bonded. The second light-adjusting layer 122 is formed such that the red light-emitting layer 105R and the green light-emitting layer 105G are overlaid with the second light-adjusting layer 122.

Finally, the main substrate 101 on which the organic EL unit and others are formed, and the sub substrate 120 on which the first light-adjusting layer 121 and the second light-adjusting layer 122 are formed are bonded by the resin layer 110. The bonding method is not particularly limited. For example, the main substrate 101 and the sub substrate 120 are bonded by adhering the main substrate 101 and the sub substrate 120 with photo-curable resin in which pigments are dispersed and then curing the resin by irradiating the resin with light. As described above, the main substrate 101 and the sub substrate 120 are arranged such that the first light-adjusting layer 121 and the organic EL unit face each other.

Figure 3:
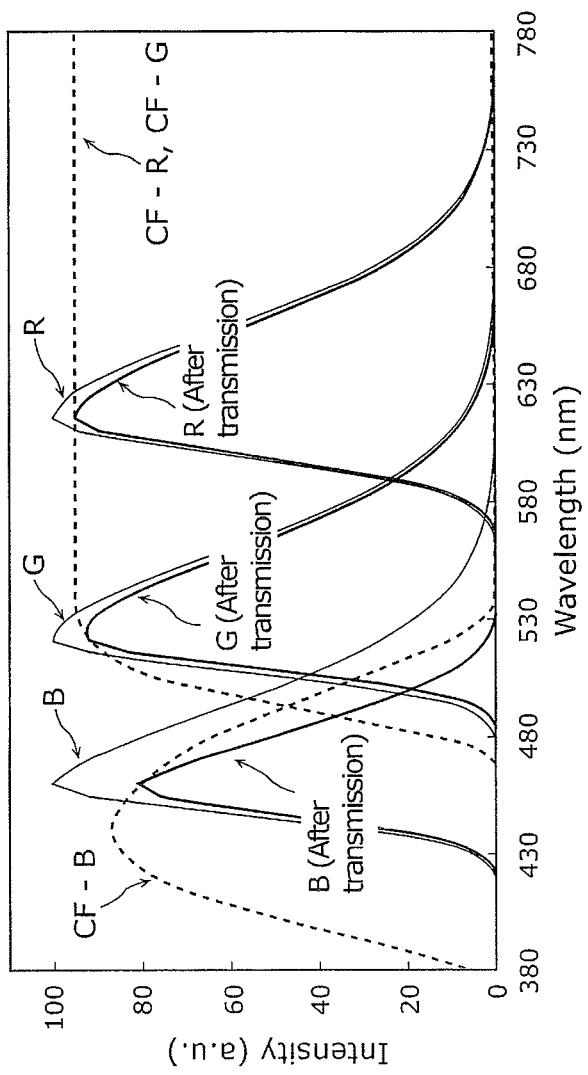
FIG. 3 is a graph illustrating an example of transmission factors of the light-adjusting layers and spectrums of light before and after transmitting the light-adjusting layers in the organic EL display device according to the example 1 of the embodiment.

FIG. 3 illustrates an example of transmission factors of the light-adjusting layers and an example of the spectrums of light before and after transmitting the light-adjusting layers in the organic EL display device 100 according to the example 1 of the embodiment. "CF-B" in FIG. 3 indicates the transmission factor of the first light-adjusting layer 121, and "CF-R, CF-G" indicates the transmission factor of the second light-adjusting layer 122. Note that, the intensity in FIG. 3 is the intensity of outgoing light obtained by the light with the intensity of 100 transmitted the light-adjusting layer, and is the transmission factor. The same applies to the other spectral graphs.

"R" indicates the red light emitted from the red light-emitting layer 105R, "G" indicates the green light emitted from the green light-emitting layer 105G, and "B" indicates the blue light emitted from the blue light-emitting layer 105B. The red light, the green light, and the blue light are illustrated using the intensity of the light emitted from the light-emitting layers of each color and exits to outside without transmitting the light-adjusting layer as 100, as in the comparative example 1 to be described later.

"R (after transmission)" indicates the red light after transmitting the second light-adjusting layer 122, "G (after transmission)" is the green light after transmitting the second light-adjusting layer 122, and "B (after transmission)" is the blue light after transmitting the first light-adjusting layer 121.

As illustrated in "CF-B" in FIG. 3, the first light-adjusting layer 121 is configured such that the blue component of visible light (with a peat at approximately 460 nm) is mainly transmitted. For example, the first light-adjusting layer 121 has a peak of transmission with which a local maximum transmission wavelength is between 400 to 480 nm, and a full width at half maximum of the transmission peak is 100 nm or smaller. More specifically, as illustrated in FIG. 3, the peak of the transmission factor of the first light-adjusting layer 121 is approximately 440 nm.

In addition, as illustrated in "CF-R, CF-G", the second light-adjusting layer 122 selectively absorbs blue light in visible light, the light other than blue light, for example, the green light (with the peak at approximately 520 nm) and the red light (with the peak at approximately 615 nm) is transmitted. More specifically, the transmission factor of the second light-adjusting layer 122 increases from approximately 470 nm, reaches the peak at approximately 530 nm, and the maximum value is maintained afterward.

Example 2

The feature of the organic EL display device according to the example 2 is that the first light-adjusting layer provided above the blue light-emitting layer, which selectively transmits blue light and selectively absorbs light other than the blue light, and a second light-adjusting layer provided above the red light-emitting layer and the green light-emitting layer, which selectively absorbs the blue light and selectively transmits the red light and the green light are provided. The second light-adjusting layer according to the Example 2 also has absorption property for absorbing light having a wavelength intermediate between the red light and the green light.

Figure 4:
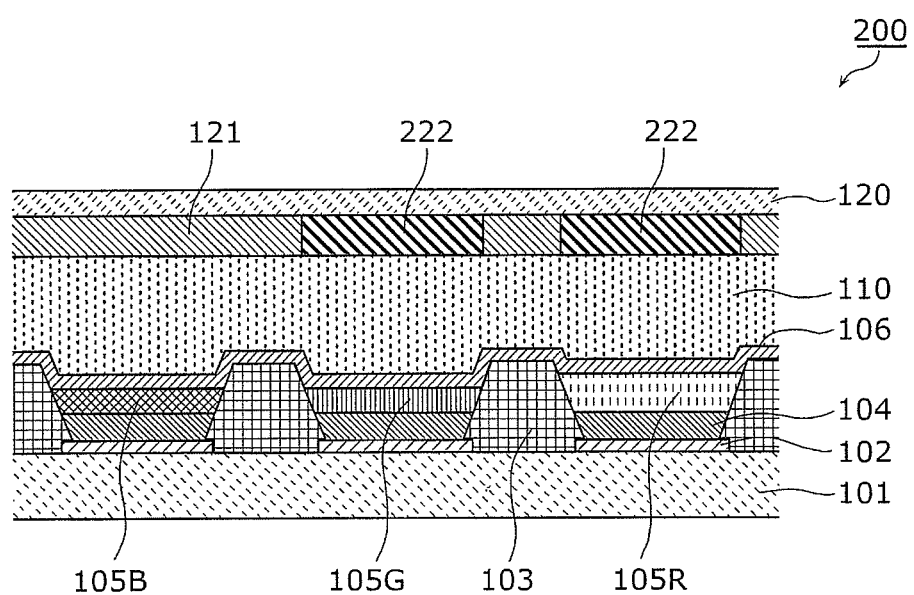
FIG. 4 is a cross-sectional view illustrating an example of a configuration of the organic EL display device according to the example 2 of the embodiment.

FIG. 4 is a cross-sectional view illustrating an example of the configuration of the organic EL display device 200 according to the example 2 of the embodiment. Note that, the schematic configuration of the organic EL display device 200 is the same as the configuration in FIG. 1. FIG. 4 is a cross-sectional view across A-A cross-section in FIG. 1.

The organic EL display device 200 in FIG. 4 differs from the organic EL display device 100 according to the example 1 in that the second light-adjusting layer 222 is included, instead of the second light-adjusting layer 122. In the following description, description shall be made focusing on the difference, omitting the points which are the same as the example 1.

The second light-adjusting layer 222 is a color filter formed above the organic EL unit, and which selectively absorbs the blue light, and selectively transmits the green light and the red light. Compared to the second light-adjusting layer 122, the second light-adjusting layer 222 has the same shape and is formed at the same position, but has different absorption wavelengths and transmission wavelengths.

Figure 5:
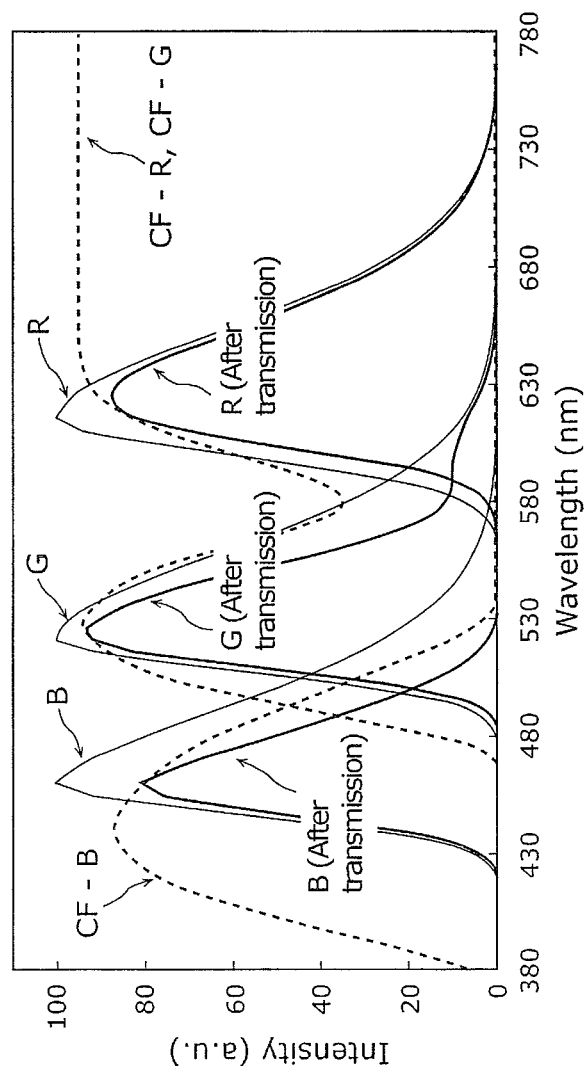
FIG. 5 is a graph illustrating an example of transmission factors of the light-adjusting layers and spectrums of light before and after transmitting the light-adjusting layers in the organic EL display device according to the example 2 of the embodiment.

FIG. 5 illustrates an example of transmission factors the light-adjusting layers and an example of the spectrums of light before and after transmitting the light-adjusting layers in the organic EL display device 200 according to the example 2 of the embodiment. Note that, the spectrums are identical to the spectrums described in the example 1 and FIG. 3, except for "CF-R, CF-G", "R (After transmission)" and "G (After transmission)".

As illustrated in "CF-R, CF-G", the second light-adjusting layer 222 is configured to transmit component of visible light other than the component of blue light. Furthermore, the second light-adjusting layer 222 is configured to have a local minimum value of the transmission factor at the component of yellow to orange. More specifically, the transmission factor of the second light-adjusting layer 222 increases from approximately 470 nm, reaches the peak approximately at 530 nm. Furthermore, the transmission factor reaches the local minimum value at approximately 580 nm, reaches the peak again at approximately 630 nm, and the maximum value is maintained afterward.

As described above, the second light-adjusting layer 222 is configured to absorb the light having a wavelength intermediate between the red light and the green light. With this, it is possible to further increase the chromatic purity of the red light and the green light.

Example 3

The organic EL display device according to the example 3 includes, in addition to the configuration of the organic EL display device according to the example 2, a third light-adjusting layer having an absorption peak with a local maximum absorption wavelength at 520 to 600 nm.

Figure 6:
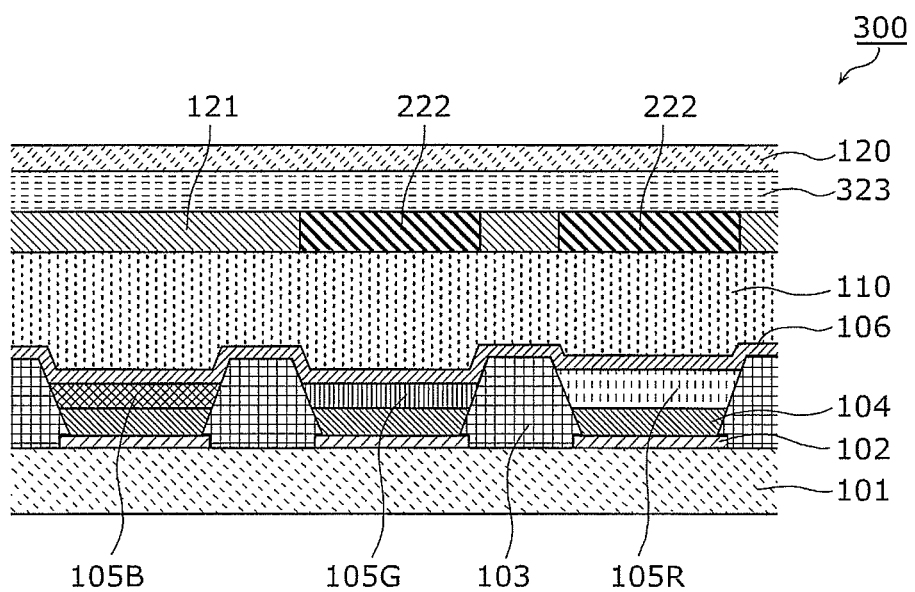
FIG. 6 is a cross-sectional view illustrating an example of a configuration of the organic EL display device according to the example 3 of the embodiment.

FIG. 6 is a cross-sectional view illustrating an example of the configuration of the organic EL display device 300 according to the example 3 of the embodiment. Note that, the schematic configuration of the organic EL display device 300 is the same as the configuration in FIG. 1. FIG. 6 is a cross-sectional view across A-A cross-section in FIG. 1.

The organic EL display device 300 illustrated in FIG. 6 differs from the organic EL display device 200 in the example 2 in that the third light-adjusting layer 323 is included. In the following description, description shall be made focusing on the difference, omitting the points which are the same as the example 2.

The third light-adjusting layer 323 is a layer formed above the organic EL unit, and is a colored phase difference film, a colored polarizer film, a colored antireflection film, or a colored antiglare film, for example. The third light-adjusting layer 323 has an absorption peak having a local maximum absorption wavelength at 520 to 600 nm. The full width at half maximum of the absorption peak is 100 nm of smaller.

Note that, the third light-adjusting layer 323 is formed between the sub substrate 120, the first light-adjusting layer 121, and the second light-adjusting layer 222, as illustrated in FIG. 6. The method of forming the third light-adjusting layer 323 on the sub substrate 120 is not particularly limited. For example, the third light-adjusting layer 323 is formed by bonding the polarizer film or others with the sub substrate 120 by adhesive such as adhesive resin. Furthermore, on the third light-adjusting layer 323, the first light-adjusting layer 121 and the second light-adjusting layer 222 are formed, in the same manner as the example 2.

Figure 7:
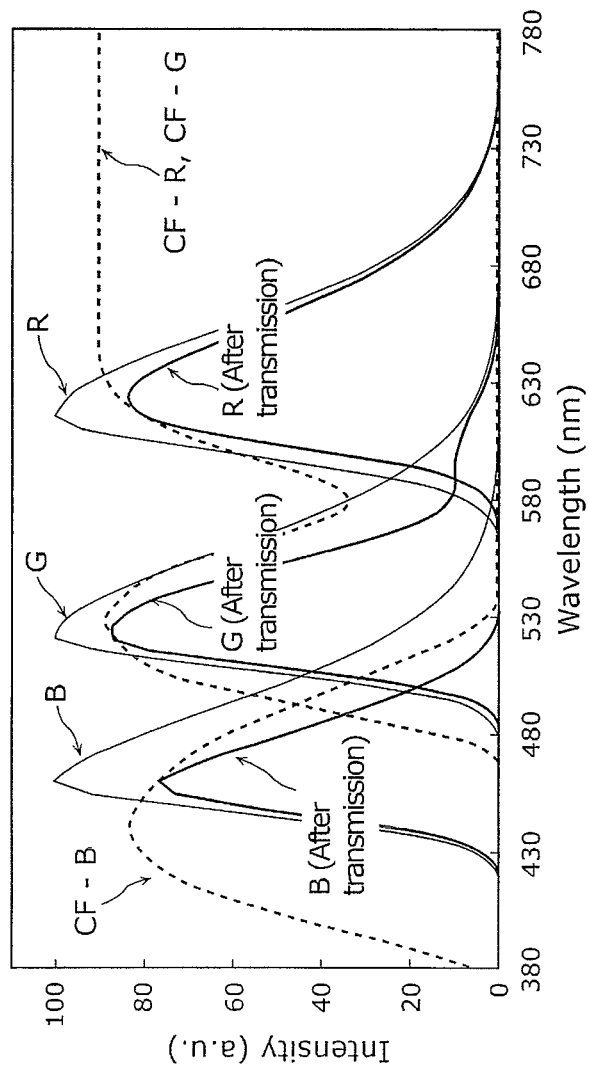
FIG. 7 is a graph illustrating an example of transmission factors of the light-adjusting layers and spectrums of light before and after transmitting the light-adjusting layers in the organic EL display device according to the example 3 of the embodiment.

FIG. 7 illustrates an example of transmission factors the light-adjusting layers and an example of the spectrums of light before and after transmitting the light-adjusting layers in the organic EL display device 300 according to the example 3 of the embodiment.

The organic EL display device 300 according to the example 3 includes the third light-adjusting layer 323. Thus, compared to "CF-R, CF-G" and "CF-B" in the example 2 illustrated in FIG. 5 and "CF-R, CF-G" and "CF-B" in FIG. 7, the transmission factor is slightly lower. Note that, the peaks of the transmission factors and the local minimum wavelengths are identical.

As described above, the organic EL display device 300 according to the example 3 includes doubled light-adjusting layers. Accordingly, the light-extraction efficiency slightly decreases. However, as shown in "R (After transmission)", "G (After transmission)", and "B (After transmission)" in FIG. 7, the overlaps of the red light, the green light, and the blue light after transmitting the light-adjusting layer are smaller. In other words, with the organic EL display device 300 according to the example 3, the purity of the red light, the green light, and the blue light can further be increased.

Example 4

The feature of the organic EL display device according to the example 4 is that, in the configuration illustrated in the example 1, the second light-adjusting layer is formed above the non-light emitting region as well. More specifically, both the first light-adjusting layer and the second light-adjusting layer are arranged above the non-light emitting region, overlapping each other.

Figure 8:
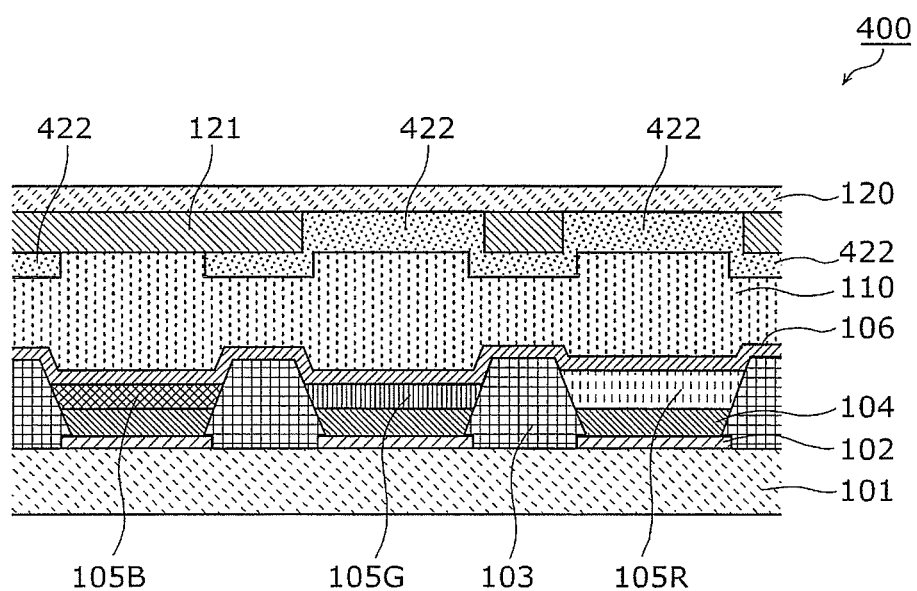
FIG. 8 is a cross-sectional view illustrating an example of a configuration of the organic EL display device according to the example 4 of the embodiment.

FIG. 8 is a cross-sectional view illustrating an example of the configuration of the organic EL display device 400 according to the example 4 of the embodiment. Note that, the schematic configuration of the organic EL display device 400 is the same as the configuration in FIG. 1. FIG. 8 is a cross-sectional view across A-A cross-section in FIG. 1.

The organic EL display device 400 in FIG. 8 differs from the organic EL display device 100 according to the example 1 in that the second light-adjusting layer 422 is included, instead of the second light-adjusting layer 122. In the following description, description shall be made focusing on the difference, omitting the points which are the same as the example 1.

The second light-adjusting layer 422 is a color filter formed above the organic EL unit, and which selectively absorbs the blue light, and selectively transmits the green light and the red light. Compared to the second light-adjusting layer 122, the second light-adjusting layer 422 has the same absorption wavelengths and transmission wavelengths, but has different shape and is formed at a different position.

More specifically, as illustrated in FIG. 8, the second light-adjusting layer 422 is not only formed overlapping the red light-emitting layer 105R and the green light-emitting layer 105G, but also formed above the bank 103 overlapping the bank 103. More specifically, the first light-adjusting layer 121 and the second light-adjusting layer 422 are formed above the bank 103 which is the non-light emitting region.

As described above, the first light-adjusting layer 121 selectively transmits the blue light, and selectively absorbs the green light and the red light. The second light-adjusting layer 422 selectively absorbs the blue light, and selectively transmits the green light and the red light. More specifically, among the external light and the light emitted from the light-emitting regions, most of the light passing through a region in which the first light-adjusting layer 121 and the second light-adjusting layer 422 overlap each other (above the bank 103) is absorbed.

Figure 9:
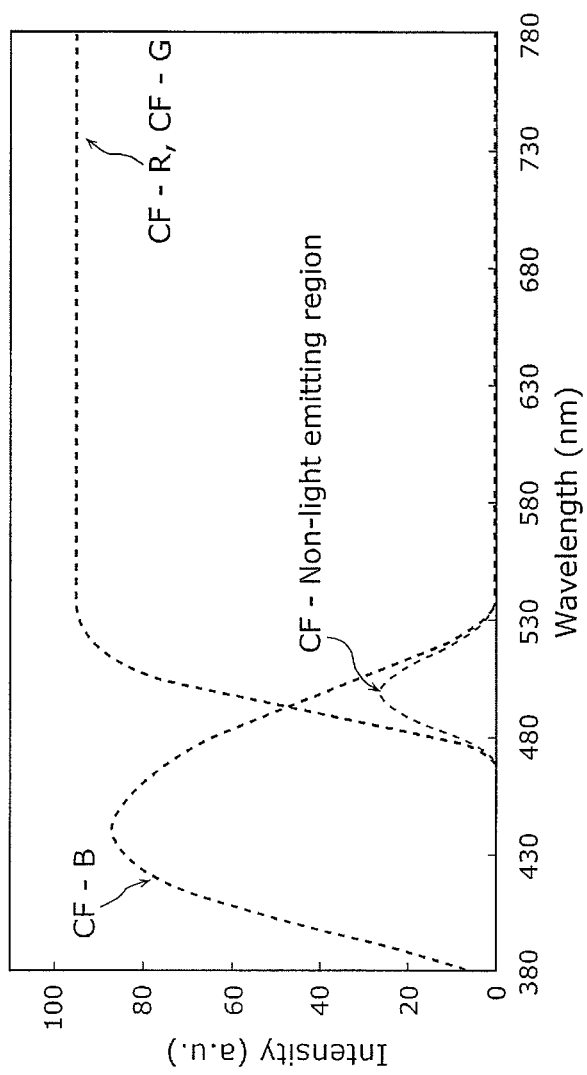
FIG. 9 is a graph illustrating an example of transmission factors of the light-adjusting layers in the organic EL display device according to the example 4 of the embodiment.

FIG. 9 illustrates an example of transmission factors of the light-adjusting layers in the organic EL display device 400 according to the example 4 of the embodiment.

"CF-B" in FIG. 9 indicates the transmission factor of the first light-adjusting layer 121, and "CF-R, CF-G" indicate the transmission factor of the second light-adjusting layer 422. "CF-non-light emitting region" indicates a transmission factor of a layer at which the first light-adjusting layer 121 and the second light-adjusting layer 422 overlap each other.

As illustrated in FIG. 9, the transmission factor of a layer in which the first light-adjusting layer 121 and the second light-adjusting layer 422 overlap each other increases from approximately 470 nm, reaches its peak approximately at 500 nm, and reduced to approximately 0 approximately at 530 nm. As described above, the layer at which the first light-adjusting layer 121 and the second light-adjusting layer 422 overlap each other has a property for partially transmitting the green light.

The light-adjusting layer having a property illustrated as "CF-non-light emitting region" in FIG. 9 is formed above the bank 103 which is the non-light emitting region. Thus, although much of the components of light entering above the bank 103 are absorbed, weak green reflected light is emitted.

Example 5

The feature of the organic EL display device according to the example 5 is that, in the configuration illustrated in the example 2, the second light-adjusting layer is formed above the non-light emitting region as well. More specifically, both the first light-adjusting layer and the second light-adjusting layer are arranged above the non-light emitting region, overlapping each other.

Figure 10:
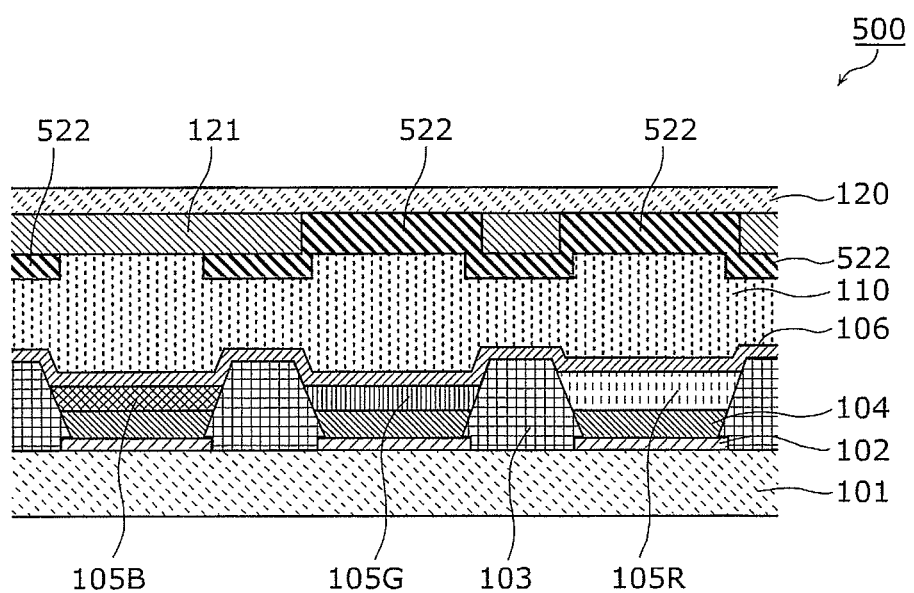
FIG. 10 is a cross-sectional view illustrating an example of a configuration of the organic EL display device according to the example 5 of the embodiment.

FIG. 10 is a cross-sectional view illustrating an example of the configuration of the organic EL display device 500 according to the example 5 of the embodiment. Note that, the schematic configuration of the organic EL display device 500 according to the example 5 is the same as the configuration in FIG. 1. FIG. 10 is a cross-sectional view across A-A cross-section in FIG. 1.

The organic EL display device 500 in FIG. 10 differs from the organic EL display device 200 according to the example 2 in that the second light-adjusting layer 522 is included, instead of the second light-adjusting layer 222. In the following description, description shall be made focusing on the difference, omitting the points which are the same as the example 2.

The second light-adjusting layer 522 is a color filter formed above the organic EL unit, and which selectively absorbs the blue light, and selectively transmits the green light and the red light. Compared to the second light-adjusting layer 222, the second light-adjusting layer 522 has the same absorption wavelengths and transmission wavelengths, but has different shape and is formed at different position.

More specifically, the shape of the second light-adjusting layer 522, and the position for forming the second light-adjusting layer 522 are the same as those of the second light-adjusting layer 422 in the example 4. More specifically, the first light-adjusting layer 121 and the second light-adjusting layer 522 are formed above the bank 103 which is the non-light emitting region.

Accordingly, in the same manner as the example 4, among the external light and the light emitted from the light-emitting regions, most of the light transmitting a region at which the first light-adjusting layer 121 and the second light-adjusting layer 522 (above the bank 103) overlap each other is absorbed.

Figure 11:
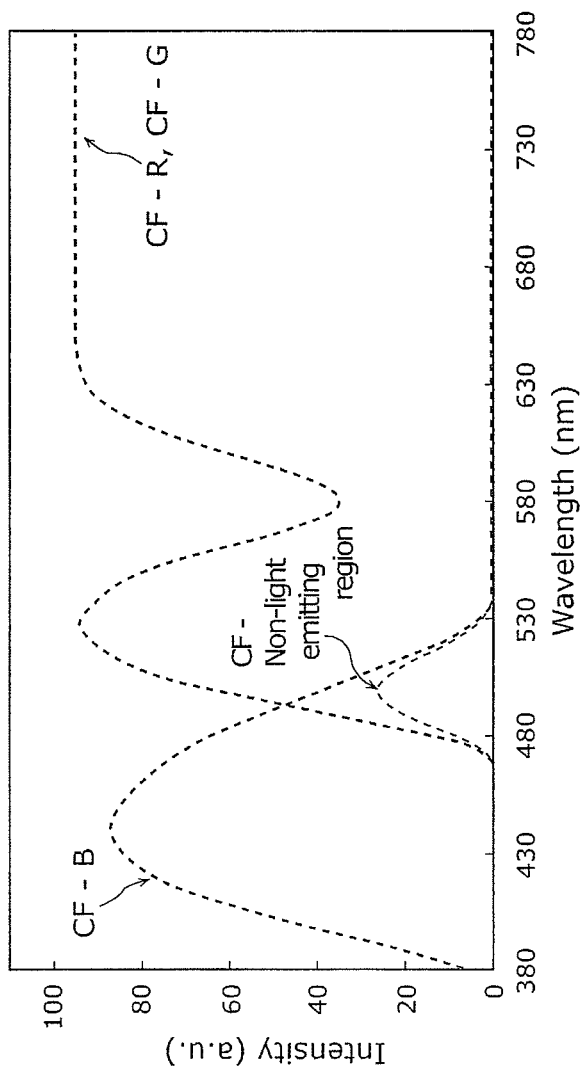
FIG. 11 is a graph illustrating an example of transmission factors of the light-adjusting layers in the organic EL display device according to the example 5 of the embodiment.

FIG. 11 illustrates an example of transmission factors the light-adjusting layers in the organic EL display device 500 according to the example 5 of the embodiment. Note that, the intensity in FIG. 11 is the intensity of outgoing light obtained by the light with the intensity of 100 transmitted the light-adjusting layer, and is the transmission factor.

"CF-B" in FIG. 11 indicates the transmission factor of the first light-adjusting layer 121, and "CF-R, CF-G" indicate the transmission factor of the second light-adjusting layer 522. "CF-non-light emitting region" indicates a transmission factor of a layer at which the first light-adjusting layer 121 and the second light-adjusting layer 522 overlap each other. As illustrated in FIG. 11, in the organic EL display device 500 according to the example 5, most of the component of the light entering a region above the bank 103, but reflected light which is weak green light is emitted, in the same manner as the example 4.

Example 6

The organic EL display device according to the example 6 includes, in addition to the configuration of the organic EL display device according to the example 5, a third light-adjusting layer having an absorption peak with a local maximum absorption wavelength at 520 to 600 nm.

Figure 12:
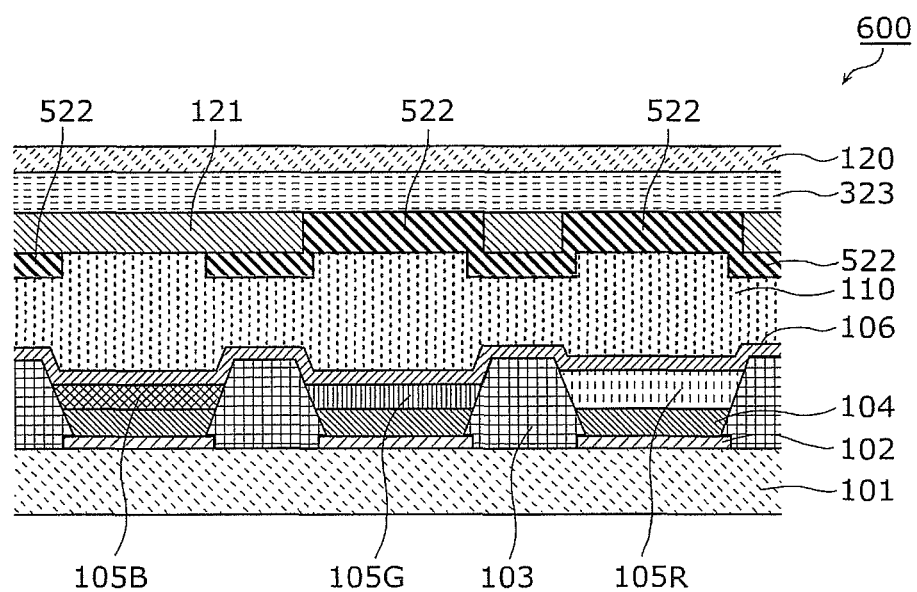
FIG. 12 is a cross-sectional view illustrating an example of a configuration of the organic EL display device according to the example 6 of the embodiment.

FIG. 12 is a cross-sectional view illustrating an example of the configuration of the organic EL display device 600 according to the example 6 of the embodiment. Note that, the schematic configuration of the organic EL display device 600 according to the example 6 is the same as the configuration in FIG. 1. FIG. 12 is a cross-sectional view across A-A cross-section in FIG. 1.

The organic EL display device 600 illustrated in FIG. 12 differs from the organic EL display device 500 in the example 5 in that the third light-adjusting layer 323 is included. In the following description, description shall be made focusing on the difference, omitting the points which are the same as the example 5.

The third light-adjusting layer 323 is identical to the third light-adjusting layer 323 illustrated in the example 3, and is a layer formed above the organic EL unit. For example, the third light-adjusting layer 323 is a colored phase difference film, a colored polarizer film, a colored antireflection film, or a colored antiglare film. The third light-adjusting layer 323 has an absorption peak with a local maximum absorption wavelength at 520 to 600 nm, and has a function for increasing the chromatic purity of the red light, the green light, and the blue light. The full width at half maximum of the absorption peak is 100 nm or smaller.

Figure 13:
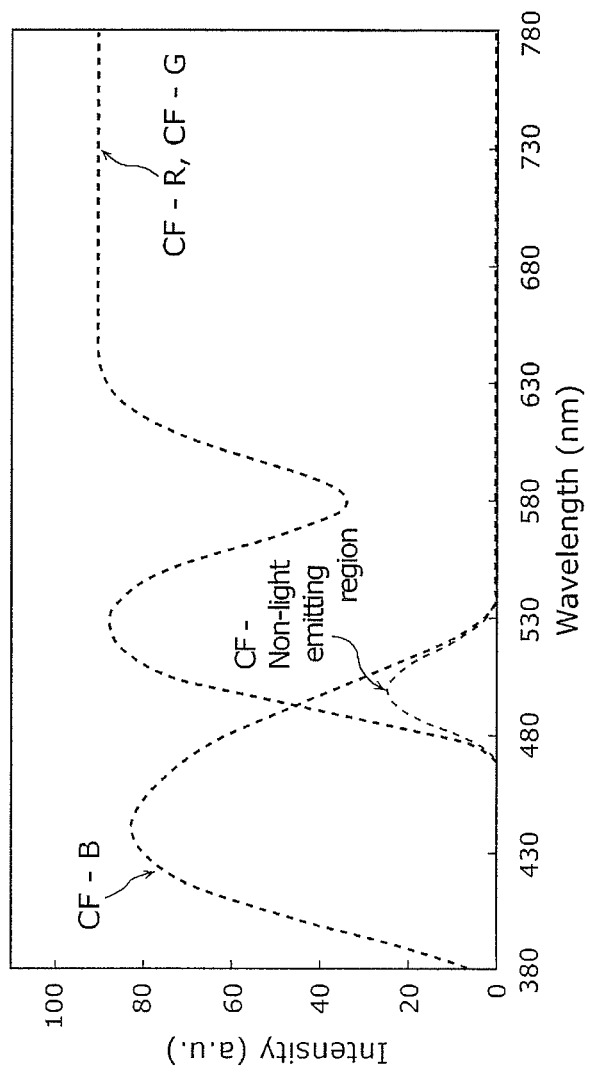
FIG. 13 is a graph illustrating an example of transmission factors of the light-adjusting layers in the organic EL display device according to the example 6 of the embodiment.

FIG. 13 illustrates an example of transmission factors the light-adjusting layers and an example of the spectrums of light before and after transmitting the light-adjusting layers in the organic EL display device 600 according to the example 6 of the embodiment.

The organic EL display device 600 according to the example 6 includes the third light-adjusting layer 323. Thus, compared to "CF-R, CF-G" and "CF-B" in the example 5 illustrated in FIG. 11 and "CF-R, CF-G" and "CF-B" in FIG. 13, the transmission factor is slightly lower. Note that, the peaks of the transmission factors and the local minimum wavelengths are identical.

As described above, the organic EL display device 600 according to the example 6 includes doubled light-adjusting layers. Accordingly, the light-extraction efficiency slightly decreases. However, as shown in "R (After transmission)", "G (After transmission)", and "B (After transmission)" in FIG. 13, the overlaps of the red light, the green light, and the blue light after transmitting the light-adjusting layer are smaller. In other words, with the organic EL display device 600 according to the example 6, the purity of the red light, the green light, and the blue light can further be increased.

Next, the comparative examples 1 to 4 shall be described. The comparative examples 1 to 4 are configured by changing part of the example 1 for comparison with the examples 1 to 6.

Comparative Example 1

The feature of the organic EL display device according to the comparative example 1 of the embodiment is that the light-adjusting layer such as a color filter is omitted.

Figure 14:
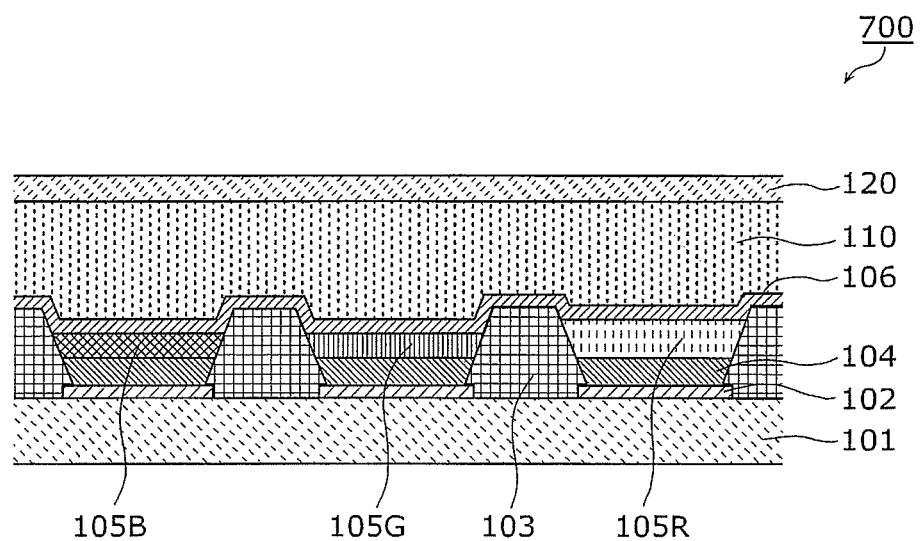
FIG. 14 is a cross-sectional view illustrating an example of a configuration of the organic EL display device according to the comparative example 1 of the embodiment.

FIG. 14 is a cross-sectional view illustrating an example of the configuration of the organic EL display device 700 according to the comparative example 1 of the embodiment. As illustrated in FIG. 14, compared to the organic EL display device 100 in the example 1, the organic EL display device 700 is different in that the first light-adjusting layer 121 and the second light adjusting layer 122 are omitted. More specifically, the main substrate 101 on which the organic EL unit is formed and the sub substrate 120 are bonded by the resin layer 110.

Figure 15:
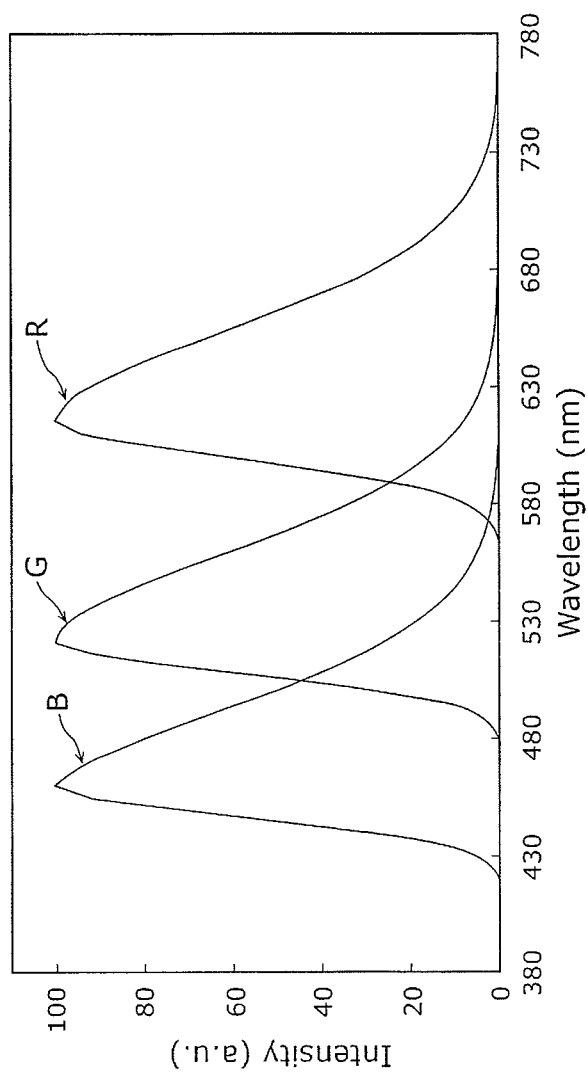
FIG. 15 is a graph illustrating an example of transmission factors of the light-adjusting layers and spectrums of light before and after transmitting the light-adjusting layers in the organic EL display device according to the comparative example 1 of the embodiment.

With this, as illustrated in "R", "G", and "B" in FIG. 15, the light-adjusting layer is omitted the organic EL display device 700 according to the comparative example 1. Thus, the light emitted from the light-emitting layers exit to outside without any change. Note that, FIG. 15 illustrates an example of the spectrums of the outgoing light from the organic EL display device 700 according to the comparative example 1 in the embodiment.

Comparative Example 2

The organic EL display device according to the comparative example 2 in the embodiment includes, in addition to the configuration in the comparative example 1, light-adjusting layers which selectively transmit each color are provided above the light-emitting layers, and an absorption layer which absorbs visible light is provided above the non-light emitting region.

Figure 16:
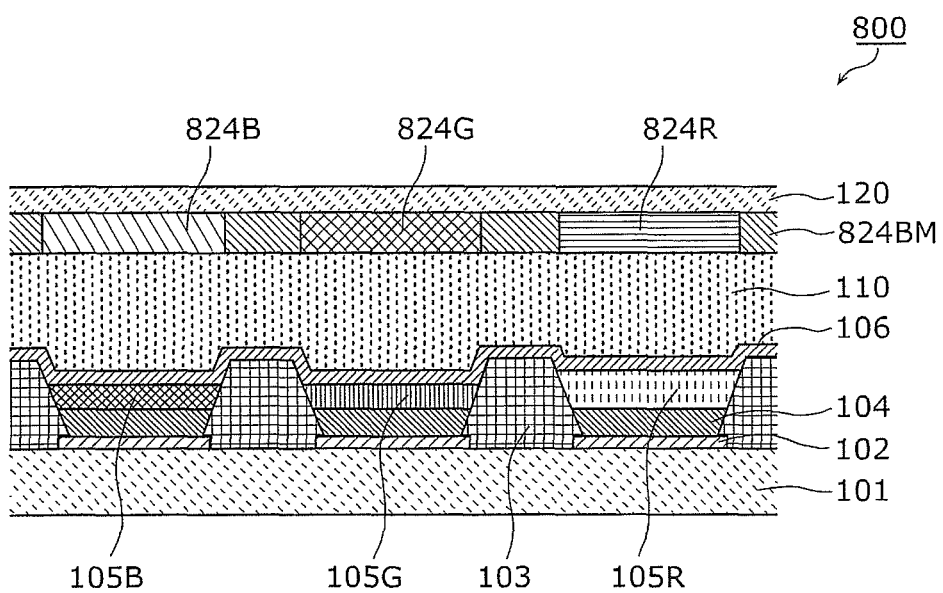
FIG. 16 is a cross-sectional view illustrating an example of a configuration of the organic EL display device according to the comparative example 2 of the embodiment.

FIG. 16 is a cross-sectional view illustrating an example of the configuration of the organic EL display device 800 according to the comparative example 2 of the embodiment. As illustrated in FIG. 16, the organic EL display device 800 differs from the organic EL display device 700 according to the comparative example 1 in that a red color filter 824R, a green color filter 824G, a blue color filter 824B, and a black matrix 824 BM are included.

The red color filter 824R, the green color filter 824G, and the blue color filter 824B are color filters which selectively transmit the red light, the green light, and the blue light, respectively. The black matrix 824BM is an absorption layer which absorbs visible light formed above the bank 103 which is the non-light emitting region.

Figure 17:
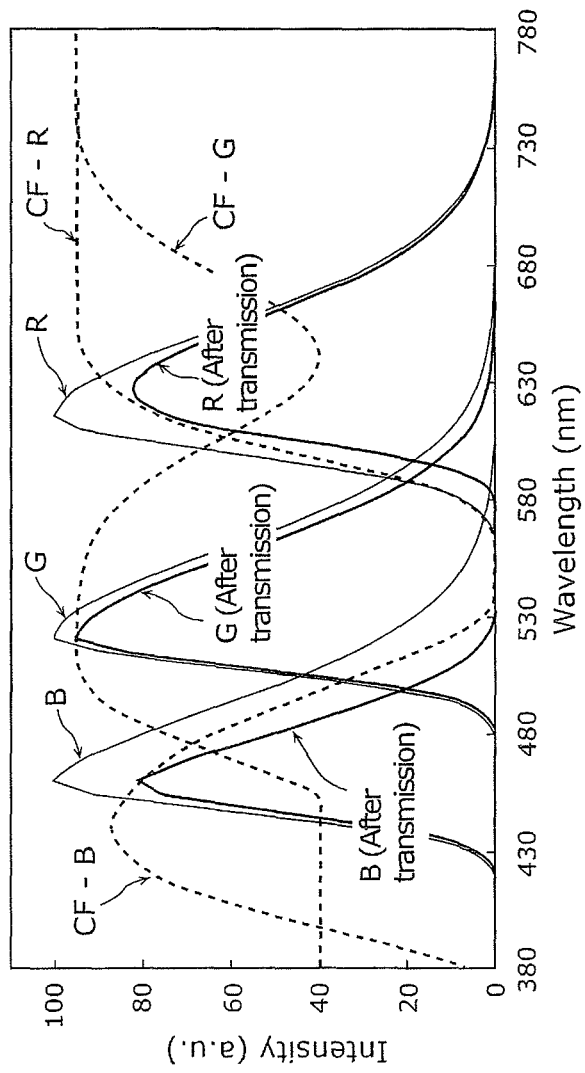
FIG. 17 is a graph illustrating an example of transmission factors of the light-adjusting layers and spectrums of light before and after transmitting the light-adjusting layers in the organic EL display device according to the comparative example 2 of the embodiment.

FIG. 17 illustrates an example of transmission factors of the light-adjusting layers and an example of the spectrums of light before and after transmitting the light-adjusting layers in the organic EL display device 800 according to the comparative example 2 of the embodiment. In FIG. 17, "CF-R" indicates the transmission factor of the red color filter 824R, "CF-G" indicates the transmission factor of the green color filter 824G, and "CF-B" indicates the transmission factor of the blue color filter 824B. As shown in "R (After transmission)", "G (After transmission)", and "B (After transmission)", the spectrums of light after transmitting the color filters have smaller overlapping portions. This indicates that the chromatic purity is increased.

Comparative Example 3

The organic EL display device according to the comparative example 3 in the embodiment includes a third light-adjusting layer having a local maximum absorption wavelength at 520 to 600 nm in the comparative example 1.

Figure 18:
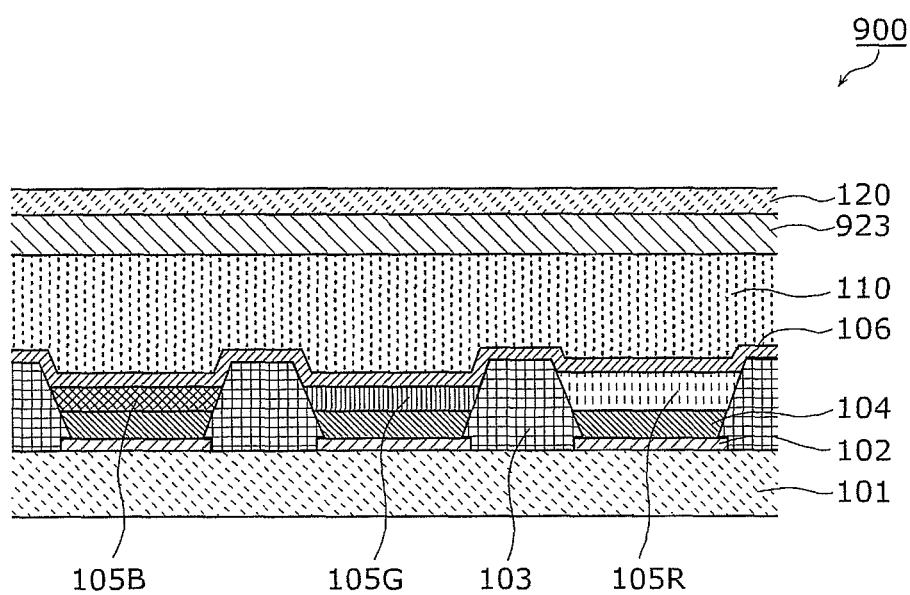
FIG. 18 is a cross-sectional view illustrating an example of a configuration of the organic EL display device according to the comparative example 3 of the embodiment.

FIG. 18 is a cross-sectional view illustrating an example of the configuration of the organic EL display device 900 according to the comparative example 3 of the embodiment. As illustrated in FIG. 18, the organic EL display device 900 is different from the organic EL display device 700 according to the comparative example 1 in that the third light-adjusting layer 923 is further included.

The third light-adjusting layer 923 is a layer formed above the organic EL unit, and is a colored phase difference film, a colored polarizer film, a colored antireflection film, or a colored antiglare film, for example. The third light-adjusting layer 923 has a local maximum absorption wavelength at 520 to 600 nm, and has a function for increasing the chromatic purity of the red light, the green light, and the blue light.

Figure 19:
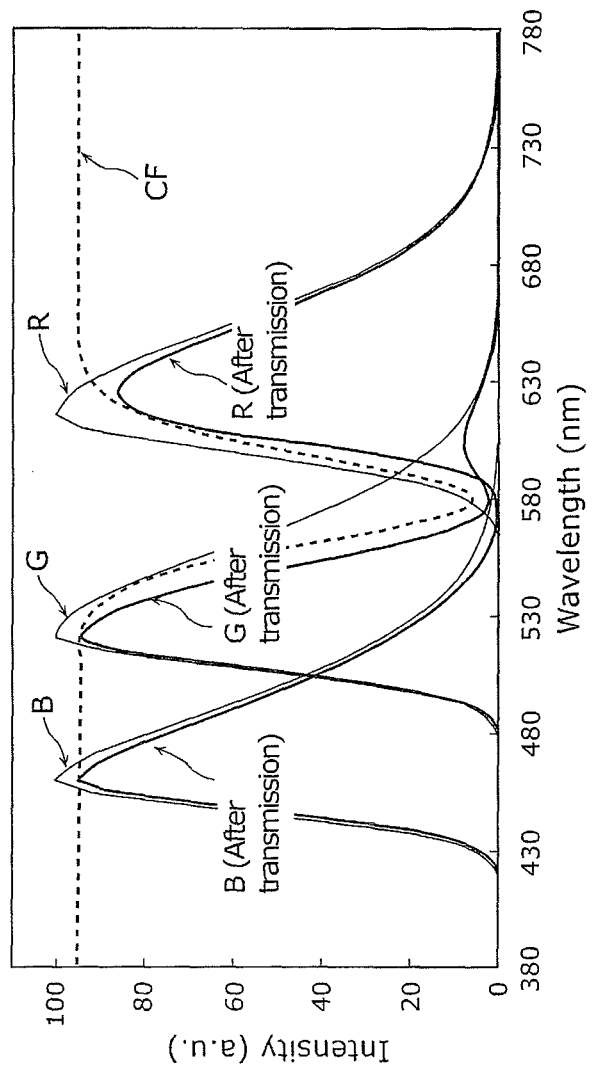
FIG. 19 is a graph illustrating an example of transmission factors of the light-adjusting layers and spectrums of light before and after transmitting the light-adjusting layers in the organic EL display device according to the comparative example 3 of the embodiment.

FIG. 19 illustrates an example of the spectrums of light before and after transmitting the light-adjusting layers in the organic EL display device 900 according to the example 3 of the embodiment. "CF" illustrated in FIG. 19 indicates the transmission factor of the third light-adjusting layer 923. As illustrated in "R (After transmission)" and "G (After transmission)", the overlapping portions of the spectrums of light after transmitting the third light-adjusting layer 923 are smaller. This indicates that the chromatic purity is increased.

Comparative Example 4

The organic EL display device according to the comparative example 4 of the embodiment is characterized in that a light-adjusting layer which selectively transmits blue is included in the configuration according to the comparative example 3 is provided.

Figure 20:
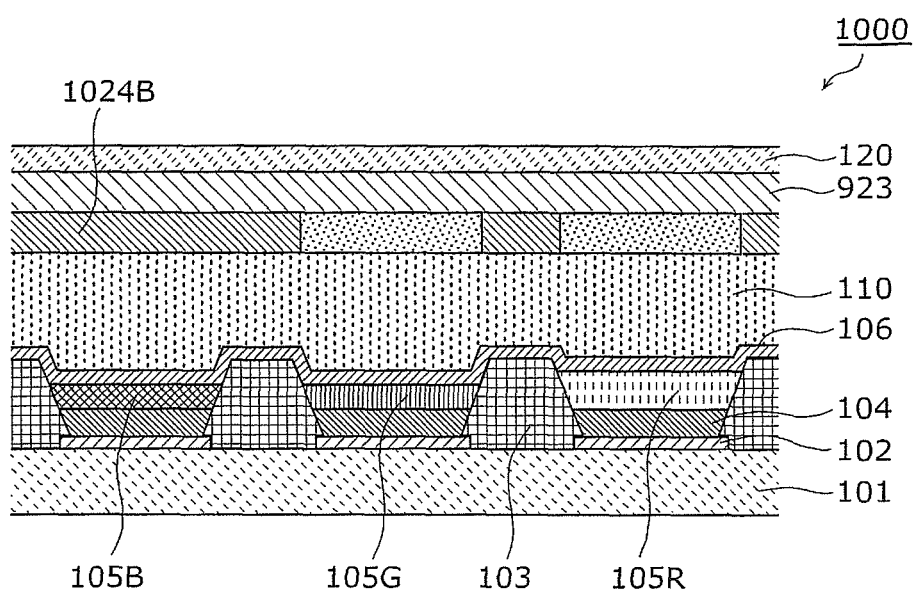
FIG. 20 is a cross-sectional view illustrating an example of a configuration of the organic EL display device according to the comparative example 4 of the embodiment.

FIG. 20 is a cross-sectional view illustrating an example of the configuration of the organic EL display device 1000 according to the comparative example 4 of the embodiment. As illustrated in FIG. 20, the organic EL display device 1000 is different from the organic EL display device 900 according to the comparative example 3 in that a blue color filter 1024B is further included.

The blue color filter 1024B is a color filter which selectively transmits the blue light. The blue color filter 1024B is formed above the blue light-emitting layer 105B and the bank 103 which is the non-light emitting region, overlapping the blue light-emitting layer 105B and the non-light emitting region.

Figure 21:
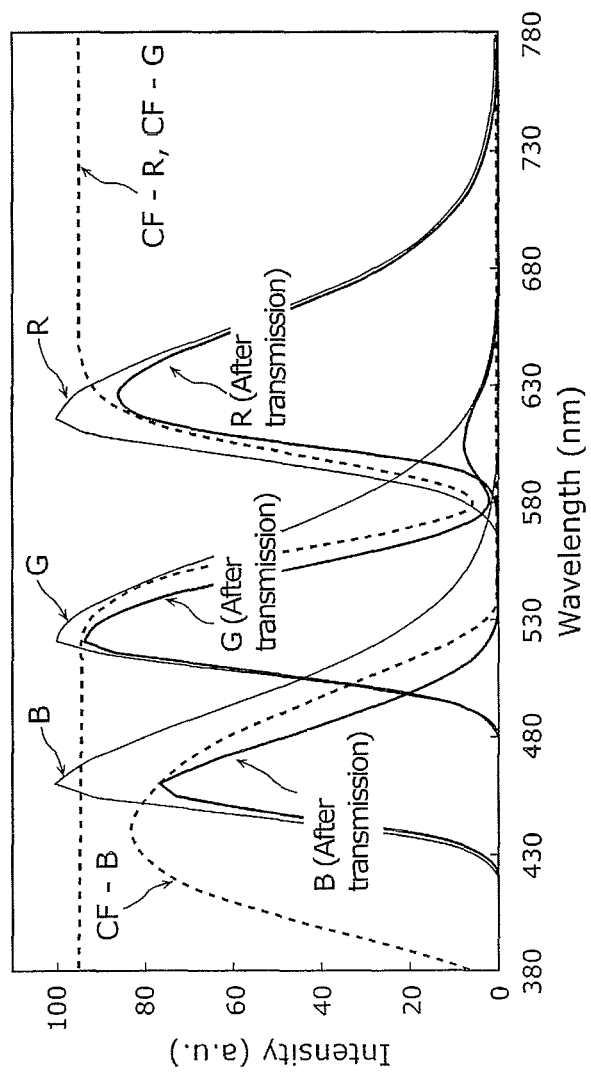
FIG. 21 is a graph illustrating an example of transmission factors of the light-adjusting layers and spectrums of light before and after transmitting the light-adjusting layers in the organic EL display device according to the comparative example 4 of the embodiment.

FIG. 21 illustrates an example of transmission factors the light-adjusting layers and an example of the spectrums of light before and after transmitting the light-adjusting layers in the organic EL display device 1000 according to the example 4 of the embodiment. "CF-B" illustrated in FIG. 21 indicates a transmission factor of a layer in which the blue color filter 1024B and the third light-adjusting layer 923 overlap each other. "CF-R, CF-G" indicates the transmission factor of the third light-adjusting layer 923. As shown in "R (After transmission)", "G (After transmission)", and "B (After transmission)", the spectrums of light after transmitting the color filters have smaller overlapping portions. This shows that the chromatic purity is increased.

The following shall describe the effects of the examples 1 to 6 in comparison with the comparative examples 1 to 4, with reference to the table 1.

TABLE 1

| Configuration | Chromaticity (CIE color coordinates) | | | Luminance ratio (%) | | | Reflectance of external light (%) | |
|---|---|---|---|---|---|---|---|---|
| | Red | Green | Blue | Red | Green | Blue | CIE color coordinates | % |
| Example 1 | (0.67, 0.33) | (0.31, 0.65) | (0.13, 0.07) | 95 | 95 | 29 | (0.35, 0.32) | 30 |
| Example 2 | (0.68, 0.32) | (0.27, 0.68) | (0.13, 0.07) | 76 | 75 | 29 | (0.28, 0.24) | 16 |
| Example 3 | (0.68, 0.32) | (0.27, 0.68) | (0.13, 0.07) | 72 | 71 | 27 | (0.28, 0.24) | 14 |
| Example 4 | (0.67, 0.33) | (0.31, 0.65) | (0.13, 0.07) | 95 | 93 | 29 | (0.43, 0.44) | 29 |
| Example 5 | (0.67, 0.33) | (0.27, 0.68) | (0.13, 0.07) | 76 | 75 | 29 | (0.37, 0.44) | 15 |
| Example 6 | (0.68, 0.32) | (0.27, 0.68) | (0.13, 0.07) | 72 | 71 | 27 | (0.37, 0.40) | 13 |
| Comparative Example 1 | (0.67, 0.33) | (0.30, 0.65) | (0.13, 0.17) | 100 | 100 | 100 | (0.38, 0.37) | 100 |
| Comparative Example 2 | (0.68, 0.32) | (0.29, 0.67) | (0.13, 0.07) | 66 | 91 | 29 | (0.36, 0.37) | 14 |
| Comparative Example 3 | (0.69, 0.31) | (0.23, 0.71) | (0.13, 0.16) | 66 | 68 | 87 | (0.27, 0.27) | 36 |
| Comparative Example 4 | (0.69, 0.31) | (0.23, 0.71) | (0.13, 0.07) | 66 | 68 | 27 | (0.22, 0.17) | 13 |

Figure 22:
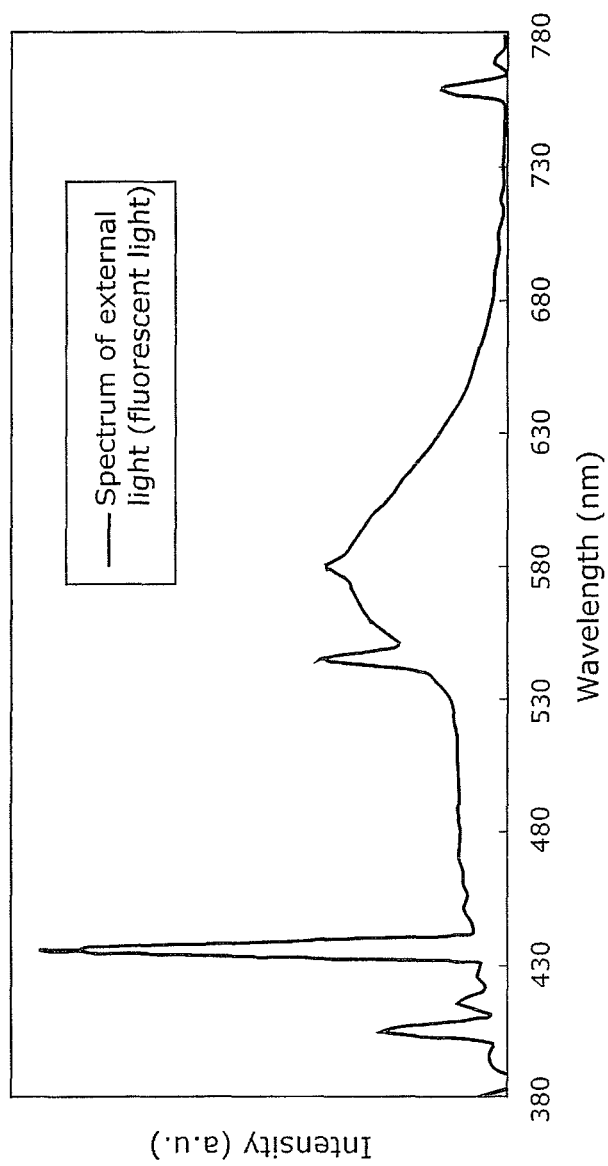
FIG. 22 is a graph illustrating an example of a spectrum of light emitted from a fluorescent light used for calculating the reflectance of external light in this embodiment.

Note that, in the description above, the spectrums after transmitting the light-adjusting layers are calculated by multiplying the EL spectrums before transmitting the light-adjusting layers and the absorption spectrums of the light-adjusting layers. The chromaticity is calculated based on the spectrums after transmitting the light-adjusting layers. The luminance ratio is calculated by an area ratio of spectrums after transmitting the light-adjusting layer (in consideration with the luminosity curve). The external light reflectance is calculated by a ratio of areas of spectrums obtained by the spectrums of fluorescent light in FIG. 22 transmitting the light-adjusting layers twice; namely when entering and when exiting (in consideration with the luminosity curve). Note that, these calculation results are separately confirmed to be effective values highly matching actually measured values.

Effects of the Example 1 and the Example 4

First, the effects of the example 1 shall be described.

In the organic EL display device 100 according to the example 1, the first light-adjusting layer 121 (for example, a blue color filter) is formed above the blue light-emitting layer 105B and the bank 103 which is the non-light emitting region, and the second light-adjusting layer 122 (for example, a yellow color filter) is formed above the red light-emitting layer 105R and the green light-emitting layer 105G. In other words, while only two light-adjusting layers are formed in the organic EL display device 100, four light-adjusting layers, namely, color filters in three colors each corresponding to one of RGB, and a black matrix needs to be formed in the technology according to the patent literature 1 (comparative example 2).

Accordingly, only two types of materials are necessary for the light-adjusting layers in the organic EL display device 100 according to the example 1, and this increases productivity. Furthermore, the number of processes is small, in addition to the small number of materials. This allows fabrication at low cost.

Furthermore, as illustrated in the table 1, the reflectance of the external light is reduced compared to the case in which no light-emitting layer is provided (comparative example 1). Thus, it is possible to reduce the reflection of the external light with the display screen. Here, blue in the external light transmitting the first light-adjusting layer 121 is selectively transmitted as illustrated in "CF-B" in FIG. 3. Thus, the external light is reflected as blue reflected light. Similarly, blue in the external light transmitting the second light-adjusting layer 122 is selectively absorbed as illustrated in "CF-R, CF-G" in FIG. 3. Thus, the external light is reflected as yellow reflected light.

Accordingly, in the organic EL display device 100 according to the example 1, the blue in the reflected light output through the first light-adjusting layer 121 and the yellow in the reflected light output from the second light-adjusting layer 122 are complementary to each other. Accordingly, the reflected light becomes white. Thus, although the reflectance of the external light is higher than that of the comparative example 2, the reflected light is achromatic color. This reduces the influence of the reflected light on chromaticity in the form of deviation and others.

As described above, the organic EL display device 100 according to the example 1 can obtain the characteristics of the comparative example 2 at extremely low cost, except for the slightly higher reflectance of external light. In consideration of mass production, highly productive low-cost fabrication is a great advantage.

Furthermore, in the organic EL display device 700 according to the comparative example 1, chromatic purity is not very good since the overlap of the blue light and the green light, and of the green light and the red light is large, as shown in "R", "G", "B" in FIG. 15. Furthermore, the reflectance of external light is high, as illustrated in the table 1. As a result, it is difficult to increase contrast.

Compared to the comparative example 1, the organic EL display device 100 according to the example 1, the reflectance of the external light is significantly reduced, which increases contrast. Furthermore, as can be seen in the comparison between FIG. 3 and FIG. 15, the overlap of the blue light and the green light is small, that is, the chromatic purity is increased.

Compared to the comparative example 3, the organic EL display device 100 according to the example 1 can suppress the reduction in luminance of the red light, as illustrated in the table 1. Furthermore, as can be seen in the comparison between FIG. 3 and FIG. 19, the overlap of the blue light and the green light is small, increasing the chromatic purity.

Compared to the comparative example 4, the organic EL display device 100 according to the example 1 can suppress the reduction in luminance of the red light and the green light. The reduction in luminance causes problems such as an increase consumption power and a shortened product life of the pixels in order to obtain a predetermined luminance. The organic EL display device 100 according to the example 1 can achieve lower consumption power and longer product life. Although there is a problem in the organic EL display device 1000 according to the example 4 that the reflected light is very strong blue-violet, the organic EL display device 100 according to the example 1 can prevent the reflected light from turning blue-violet.

The organic EL display device 400 according to the example 4 achieves the following effects, in addition to the effects of the organic EL display device 100 according to the example 1.

In the organic EL display device 400 according to the example 4, the first light-adjusting layer 121 (for example, the blue color filter) and the second light-adjusting layer 422 (for example, the yellow color filter) are provided overlapping each other above the bank 103 which is the non-light emitting region. Accordingly, the color of the non-light emitting region becomes closer to black, allowing the reflected light to be more closer to white.

Furthermore, as illustrated in FIG. 9, when the external light enters the non-light emitting region, weak green reflected light is emitted. The reflection of the green light cancels out the blue-violet light emitted from the organic EL display device 400, thereby increasing the contrast between the non-light emitting region and the light emitting region.

Effects of the Example 2 and the Example 5

Next, the effects of the example 2 shall be described. The organic EL display device 200 according to the example 2 achieves the following effects, in addition to the effects of the organic EL display device 100 according to the example 1.

As illustrated in "CF-R, CF-G" in FIG. 5, in the organic EL display device 200 according to the example 2, the second light-adjusting layer 222 has a local maximum absorption wavelength approximately at 520 to 600 nm. With this configuration, as illustrated in FIG. 5, it is possible to further increase the chromatic purity of the red light and the green light by absorbing light having a wavelength intermediate between the red light and the green light. Furthermore, since orange light is absorbed, it is possible to reduce the reflection of the external light. In particular, this configuration is particularly effective for reducing the reflection of the fluorescent light, since the light from the fluorescent light contains high orange component.

The organic EL display device 500 according to the example 5 achieves the following effects of the organic EL display device 400 according to the example 4, in addition to the effects of the organic EL display device 200 according to the example 2.

More specifically, it is possible to set the color of the non-light emitting region closer to black, and to set the color of reflected light closer to white. Furthermore, the contrast can be further increased by the green reflection from the non-light emitting region.

Effects of the Example 3 and the Example 6

Next, the effects of the example 3 shall be described. The organic EL display device 300 according to the example 3 achieves the following effects, in addition to the effects of the organic EL display device 200 according to the example 2.

The organic EL display device 300 according to the example 3 further includes the third light-adjusting layer 323. Thus, as illustrated in the table 1 or in FIGS. 5 and 7, although the luminance of the red light and the blue light slightly decreases, it is possible to further reduce the reflectance of the external light, and further increase the chromatic purity.

The organic EL display device 600 according to the example 6 achieves the effects of the organic EL display device 400 according to the example 4, in addition to the effects of the organic EL display device 300 according to the example 3.

More specifically, it is possible to set the color of the non-light emitting region closer to black, and to set the color of reflected light closer to white. Furthermore, the contrast can be further increased by the green reflection from the non-light emitting region.

Although only some exemplary embodiments of the organic EL display device according to the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

Figure 23:
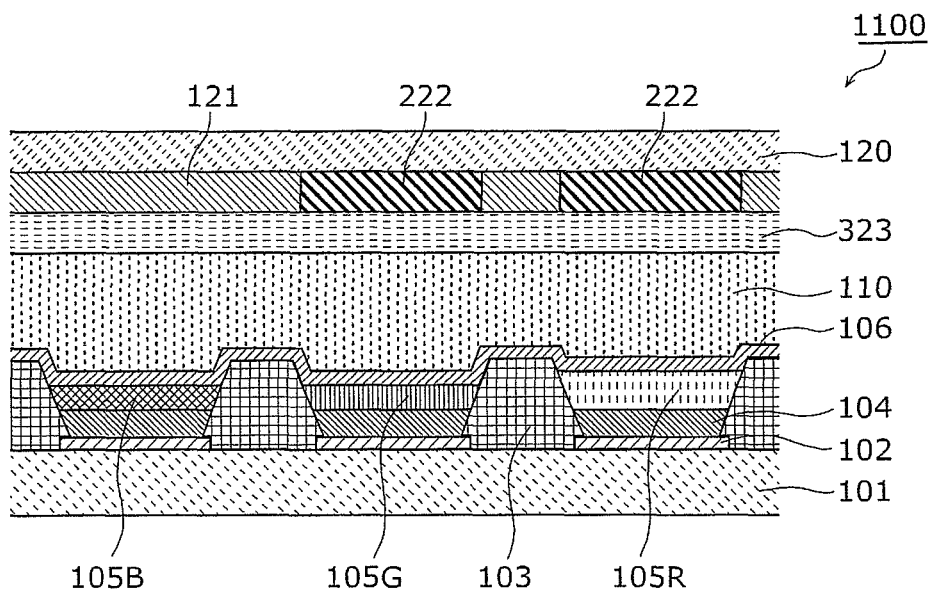
FIG. 23 is a cross-sectional view illustrating an example of a configuration of the organic EL display device according to another example of the embodiment.

For example, in the example 3 and the example 6, the description is made for a configuration in which the organic EL unit including the red light-emitting layer 105R, the green light-emitting layer 105G and the blue light-emitting layer 105B, the first light-adjusting layer 121, and the third light-adjusting layer 323 are formed in this order. However, as in the organic EL display device 1100 illustrated in FIG. 23, the organic EL unit, the third light-adjusting layer 323, and the first light-adjusting layer 121 are formed in this order. In other words, the first light-adjusting layer 121 and the third light-adjusting layer 323 are formed in this order above the sub substrate 120. The main substrate 101 and the sub substrate 120 may be arranged such that the third light-adjusting layer 323 and the organic EL unit face each other.

Figure 24:
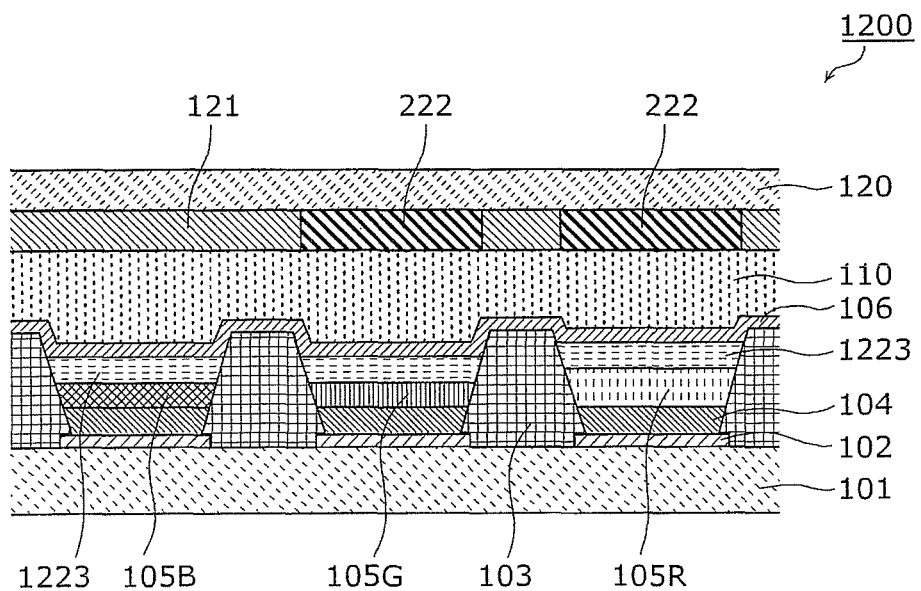
FIG. 24 is a cross-sectional view illustrating an example of a configuration of the organic EL display device according to another example of the embodiment.

The sub substrate 120 may also be made of colored glass or plastic, and serve as the third light-adjusting layer 323 described above. Alternatively, the resin layer 110 may be made of colored resin, and may serve as the third light-adjusting layer 323. As illustrated in the organic EL display device 1200 in FIG. 24, a third light-adjusting layer 1223 may be formed as one or more colored organic layers provided between the anode 102 and the cathode 106. Here, as illustrated in FIG. 24, the third light-adjusting layer may be provided between the organic light-emitting layers (the red light-emitting layer 105R, the green light-emitting layer 105G, and the blue light-emitting layer 105B) and the cathode 106. Alternatively, the third light-adjusting layer may be provided between the organic light-emitting layers and the anode 102.

Figure 25:
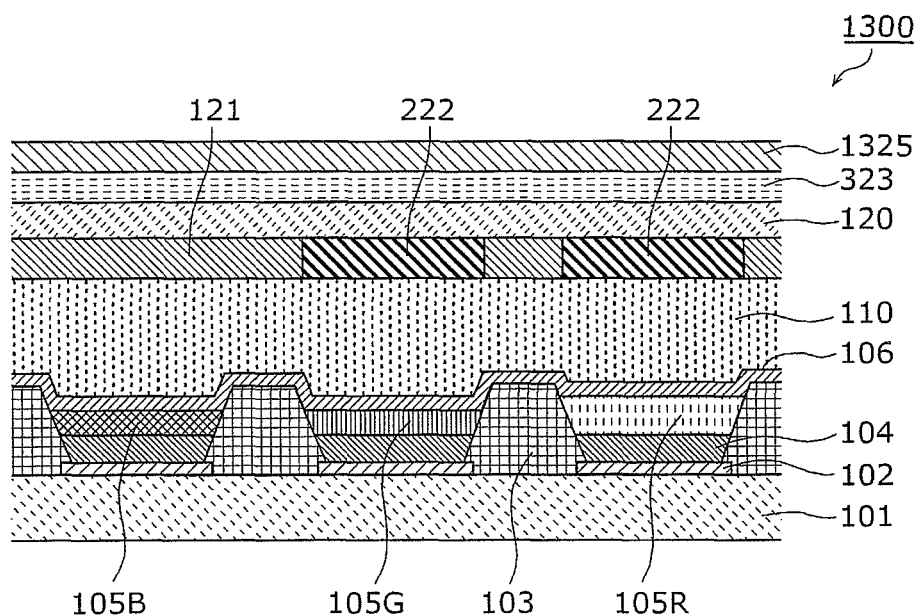
FIG. 25 is a cross-sectional view illustrating an example of a configuration of the organic EL display device according to another example of the embodiment.

The antireflection film or the antiglare film may be bonded with the colored resin layer which serves as the third light-adjusting layer. For example, as in the organic EL display device 1300 in FIG. 25, a film 1325 such as an antireflection film or an antiglare film bonded with the sub substrate 120 by the third light-adjusting layer 323 may be provided.

Furthermore, in the example 1, the configuration in which the first light-adjusting layer 121 and the second light-adjusting layer 122 are integrated in the same layer is described in the example 1. However, the first light-adjusting layer 121 and the second light-adjusting layer 122 may be provided in different layers. For example the sub substrate 120 may be formed between the first light-adjusting layer 121 and the second light-adjusting layer 122.

Figure 26:
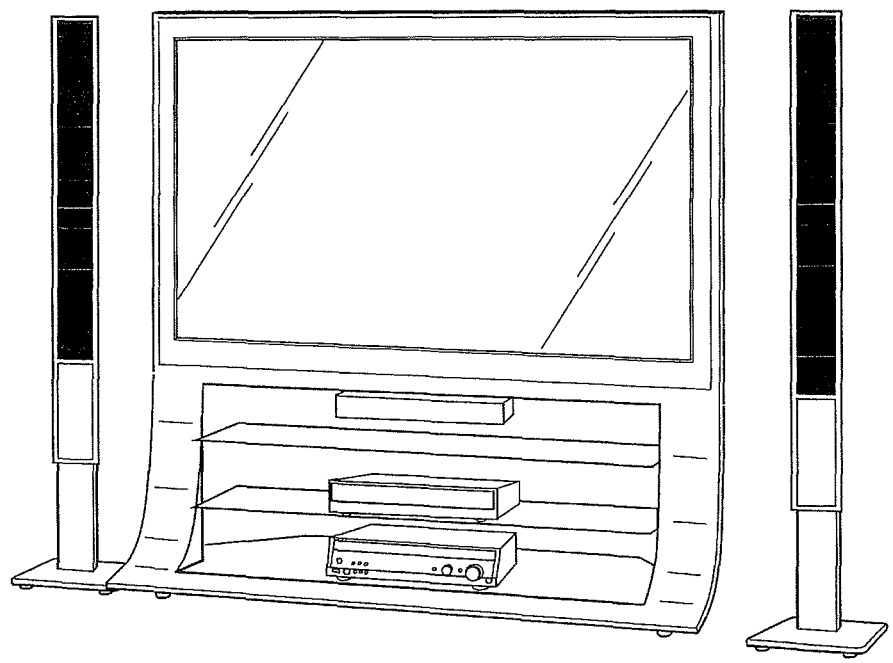
FIG. 26 is an external view of an example of application of the organic EL display device according to the embodiment.

Note that, the organic EL display device according to the embodiment may be used for a digital television illustrated in FIG. 26, for example.

INDUSTRIAL APPLICABILITY

The organic EL display device according to the present invention can be fabricated at low cost. In addition, effects such as balanced chromatic purity, transmission factor, reduced reflection, and reflected colors are achieved. The organic EL display device is applicable to any display device such as televisions, personal computers, and mobile phones, for example.

What is claimed is:

1. An organic electroluminescent (EL) display device comprising:
    a first substrate;
    an organic EL unit formed above the first substrate and including a red light-emitting region which emits red light, a green light-emitting region which emits green light, a blue light-emitting region which emits blue light, and a non-light emitting region;
    a first light-adjusting layer formed above the blue light-emitting region and the non-light emitting region, which selectively transmits the blue light and selectively absorbs the green light and the red light;
    a second light-adjusting layer formed above the red light-emitting region and the green light-emitting region, which selectively absorbs the blue light and selectively transmits the green light and the red light; and
    a third light-adjusting layer provided above the organic EL unit,
    wherein the third light-adjusting layer has an absorption peak with a local maximum absorption wavelength in a range between 520 and 600 nm, and a full width at half maximum of the absorption peak is 100 nm or smaller.

2. The organic electroluminescent display device according to claim 1,
    wherein the second light-adjusting layer is also provided above the non-light emitting region.

3. The organic electroluminescent display device according to claim 2,
    wherein a region above the non-light emitting region and in which the first light-adjusting layer and the second light-adjusting layer are formed has a transmission property for transmitting light having a wavelength intermediate between the blue light and the green light.

4. The organic electroluminescent display device according to claim 1,
    wherein the second light-adjusting layer has an absorption peak with a local maximum absorption wavelength in a range between 520 and 600 nm, and
    a full width at half maximum of the absorption peak is 100 nm or smaller.

5. The organic electroluminescent display device according to claim 1, further comprising
    a second substrate which is different from the first substrate,
    wherein the first light-adjusting layer is formed above the second substrate, and
    the first substrate and the second substrate are arranged such that the first light-adjusting layer and the organic EL unit face each other.

6. The organic electroluminescent display device according to claim 5, wherein the third light-adjusting layer is the second substrate made of colored glass or plastic.

7. The organic electroluminescent display device according to claim 5, further comprising
one of an antireflection film and an antiglare film,
wherein the third light-adjusting layer is a colored resin layer, and
the one of the antireflection film and the antiglare film and the second substrate are bonded by the third light-adjusting layer.

8. The organic electroluminescent display device according to claim 1,
wherein the third light-adjusting layer is a colored phase difference film, a colored polarizer film, a colored antireflection film, or a colored antiglare film.

9. The organic electroluminescent display device according to claim 1,
wherein the organic EL unit, the first light-adjusting layer, and the third light-adjusting layer are stacked in this order.

10. The organic electroluminescent display device according to claim 1,
wherein the organic EL unit, the third light-adjusting layer, and the first light-adjusting layer are stacked in this order.

11. The organic electroluminescent display device according to claim 1, further comprising
a second substrate which is different from the first substrate,
wherein the first light-adjusting layer and the third light-adjusting layer are formed on the second substrate in this order, and
the first substrate and the second substrate are arranged such that the first light-adjusting layer and the organic EL unit face each other.

12. The organic electroluminescent display device according to claim 1, further comprising
a second substrate which is different from the first substrate,
the third light-adjusting layer is a colored resin layer, and
the organic EL unit and the first light-adjusting layer are bonded by the third light-adjusting layer.

13. The organic electroluminescent display device according to claim 1,
wherein the first light-adjusting layer has a transmission peak with a local maximum wavelength in a range between 400 and 480 nm, and
a full width at half maximum of the transmission peak is 100 nm or smaller.

14. The organic electroluminescent display device according to claim 1,
wherein a wavelength of an absorption peak of the second light-adjusting layer is 500 nm or smaller, and a wavelength of a transmission peak of the second light-adjusting layer is 500 nm or greater.

* * * * *